(12) United States Patent
Jin

(10) Patent No.: US 10,698,765 B2
(45) Date of Patent: Jun. 30, 2020

(54) TECHNIQUES TO RECOVER DATA IN A NETWORK STORAGE SYSTEM

(71) Applicant: Intel Corporation, Santa Clara, CA (US)

(72) Inventor: Jun Jin, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 206 days.

(21) Appl. No.: 15/778,616

(22) PCT Filed: Dec. 23, 2015

(86) PCT No.: PCT/CN2015/098483
§ 371 (c)(1),
(2) Date: May 23, 2018

(87) PCT Pub. No.: WO2017/107107
PCT Pub. Date: Jun. 29, 2017

(65) Prior Publication Data
US 2018/0293134 A1    Oct. 11, 2018

(51) Int. Cl.
| | | |
|---|---|---|
| *G06F 11/10* | (2006.01) | |
| *H03M 13/37* | (2006.01) | |
| *G06F 11/07* | (2006.01) | |
| *G06F 11/14* | (2006.01) | |
| *H04L 29/08* | (2006.01) | |

(52) U.S. Cl.
CPC ...... *G06F 11/1076* (2013.01); *G06F 11/0727* (2013.01); *G06F 11/1464* (2013.01); *H03M 13/3761* (2013.01); *H04L 67/1097* (2013.01)

(58) Field of Classification Search
CPC ............. G06F 11/1076; G06F 11/0727; G06F 11/1464; H04L 67/1097; H03M 13/3761
See application file for complete search history.

(56) References Cited

U.S. PATENT DOCUMENTS

| | | | |
|---|---|---|---|
| 8,296,515 B1 | 10/2012 | Saxena et al. | |
| 2014/0380125 A1* | 12/2014 | Calder | G06F 11/10 714/766 |
| 2016/0211869 A1* | 7/2016 | Blaum | H03M 13/373 |
| 2016/0380650 A1* | 12/2016 | Calder | G06F 11/1076 714/766 |

(Continued)

FOREIGN PATENT DOCUMENTS

| | | |
|---|---|---|
| CN | 102843212 A | 12/2012 |
| CN | 103152652 A | 6/2013 |
| CN | 104461781 A | 3/2015 |

OTHER PUBLICATIONS

H. S. G. et al., "SpreadStore: A LDPC Erasure Code Scheme for Distributed Storage System," 2010 International Conference on Data Storage and Data Engineering, Bangalore, 2010, pp. 154-158. (Year: 2010).*

(Continued)

*Primary Examiner* — Cynthia Britt
(74) *Attorney, Agent, or Firm* — Compass IP Law PC

(57) ABSTRACT

Examples include techniques to recover data in a storage. In some examples, an erasure code may be implemented to protect a data file or data object stored to nodes of a networked storage system. Corrupted data included in source data blocks may be recovered and verified based on the erasure code.

25 Claims, 11 Drawing Sheets

(56) References Cited

U.S. PATENT DOCUMENTS

2017/0168897 A1* 6/2017 Blaum ............... G06F 11/1076
2018/0357019 A1* 12/2018 Karr .................... G06F 3/0685

OTHER PUBLICATIONS

S. Kim and S. Lee, "Rateless erasure resilient codes for content storage and distribution in P2P networks," 2009 11th International Conference on Advanced Communication Technology, Phoenix Park, 2009, pp. 444-446. (Year: 2009).*
Y. Zhang, C. Wu, J. Li and M. Guo, "TIP-Code: A Three Independent Parity Code to Tolerate Triple Disk Failures with Optimal Update Connplextiy," 2015 45th Annual IEEE/IFIP International Conference on Dependable Systems and Networks, Rio de Janeiro, 2015, pp. 136-147. (Year: 2015).*
F. Zhang, J. Huang and C. Xie, "Two Efficient Partial-Updating Schemes for Erasure-Coded Storage Clusters," 2012 IEEE Seventh International Conference on Networking, Architecture, and Storage, Xiamen, Fujian, 2012, pp. 21-30. (Year: 2012).*
International Search Report and Written Opinion for PCT Patent Application No. PCT/CN2015/098483, dated Sep. 21, 2016, 11 pages.

* cited by examiner

Table 400

| # of Corrupted Blocks | Corruptions in Group 320-1 | Corruptions in Group 320-2 | Data Recovery Possible | Data Verification Possible | Notes |
|---|---|---|---|---|---|
| 1 | 1 | 0 | Yes | Yes | Case 1 |
| 2 | 1 | 1 | Yes | Yes | Case 2 |
| 2 | 2 | 0 | Yes | Yes | Case 3 |
| 3 | 2 | 1 | Yes | Yes | Case 4 |
| 3 | 3 | 0 | Yes | Yes | Case 5 |
| 4 | 1 | 3 | Yes | Yes | Case 6 |
| 4 | 2 | 2 | Yes | No | Case 7 |
| 4 | 4 | 0 | Yes | No | Case 8 |

IMPLEMENT, AT A PROCESSOR CIRCUIT, AN ERASURE CODING SCHEME FOR A NETWORKED STORAGE SYSTEM BASED ON (k, r, p, m), WHERE k REPRESENTS SOURCE DATA BLOCKS SEPARATELY STORED TO NODES OF THE NETWORKED STORAGE SYSTEM, r REPRESENTS A NUMBER OF LOCAL GROUPS SEPARATELY INCLUDING k/r SOURCE DATA BLOCKS, p REPRESENT A NUMBER OF LOCAL PARITY BLOCKS SEPARATELY STORED TO NODES OF THE NETWORKED STORAGE SYSTEM FOR PROTECTING THE k/r SOURCE DATA BLOCKS INCLUDED IN EACH LOCAL GROUP AND m REPRESENTS A NUMBER OF GLOBAL PARITY BLOCKS SEPARATELY STORED TO NODES OF THE NETWORKED STORAGE SYSTEM FOR PROTECTING ALL k SOURCE DATA BLOCKS
902

DETERMINE THAT DATA INCLUDED IN ONE OR MORE SOURCE DATA BLOCKS IS CORRUPTED OR UNREADABLE
904

RECOVER DATA INCLUDED IN THE ONE OR MORE CORRUPTED DATA SOURCE DATA BLOCKS USING NON-CORRUPTED SOURCE DATA BLOCKS AND ONE OR MORE LOCAL PARITY BLOCKS OR USING ONE OR MORE GLOBAL PARITY BLOCKS
906

*FIG. 9*

Storage Medium _1000_

*Computer Executable Instructions for 900*

*FIG. 10*

TECHNIQUES TO RECOVER DATA IN A NETWORK STORAGE SYSTEM

CLAIM OF PRIORITY

This application is a U.S. National Phase application under 35 U.S.C. § 371 of International Application No. PCT/CN2015/098483 filed Dec. 23, 2015, entitled "TECHNIQUES TO RECOVER DATA IN A NETWORK STORAGE SYSTEM", the entire contents of which are incorporated herein by reference.

TECHNICAL FIELD

Examples described herein are generally related to techniques to recover data.

BACKGROUND

Network-based storage systems associated with storing data files or data objects are growing in size and complexity. These storage systems may be associated with scalable numbers of computer-storage nodes ("nodes") interconnected via one or more networks. However, large data files or data objects, sometimes referred to as "big data" are growing at sizes and complexities that may exceed infrastructure supporting nodes of a storage system. Triple replication of data that was once the norm for protecting data integrity is becoming prohibitively expensive for object storage systems. For this reason, large storage systems may utilize erasure coding schemes to provide data protection or reliability while using a smaller amount of storage overhead compared to triple replication.

BRIEF DESCRIPTION OF THE DRAWINGS

FIG. 4 illustrates an example table.
FIG. 9 illustrates an example of a fourth logic flow.
FIG. 10 illustrates an example of a storage medium.

DETAILED DESCRIPTION

Figure 1:
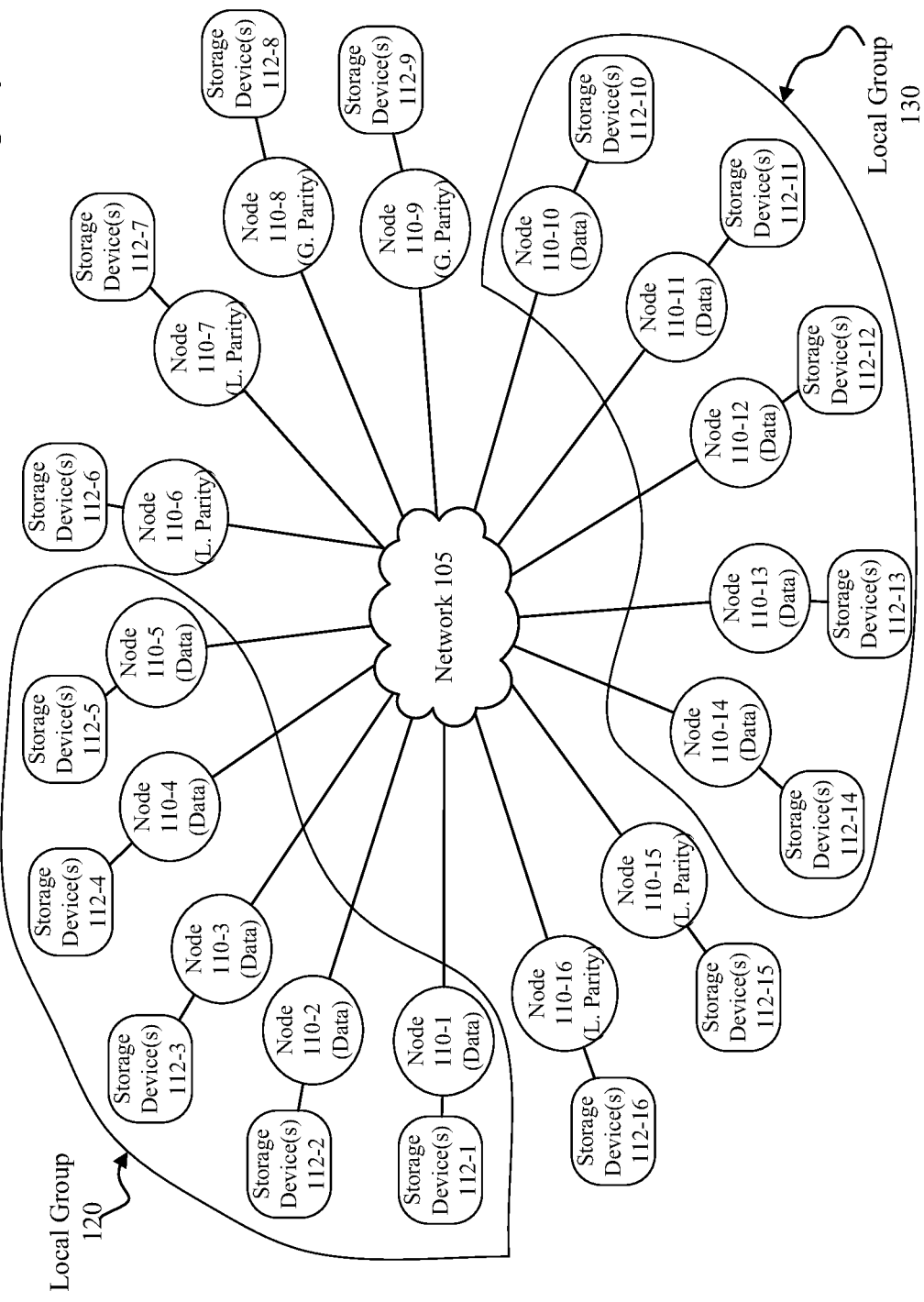
FIG. 1 illustrates an example storage system.

As contemplated in the present disclosure, large network-based storage system may utilize erasure coding schemes to reduce storage overhead compared to triple replication. Vandermond Reed-Solomon erasure codes may be a common choice for use in some network-based storage systems. Vandermond Reed-Solomon erasure codes use a classical error-correcting construction relying on polynomials over finite fields. For example, an (k, m) erasure code provides a way to take k blocks and generate m blocks ("parity blocks"), such that any m data or parity blocks out of a total of n=m+k suffices to reconstruct the original m blocks. Thus a Vandermond Reed-Solomon erasure code of (k, m) may provide normalized storage overhead of n/k instead of 300% overhead needed for triple replication.

According to some examples, a data file or data object may be partitioned in multiple source data blocks and then the source data blocks may be stored to a plurality of nodes in network storage system each having a storage device (e.g., hard disk drives and/or solid state drives). For these examples a Vandermond Reed-Solomon erasure code of (k, m) may be used to protect the data included in the multiple source data blocks k stored to the plurality of nodes. Responsive to a source data block being reported as corrupted or unreadable (e.g., disk broken), k source data blocks (out of k+m) that may be spread over the plurality of nodes are needed to recover data in the corrupted source data block. Retrieving the k source data blocks stored throughout a network of nodes in a storage system may incur a heavy network overhead.

Some techniques have been implemented to reduce network overhead associated with retrieving k source data blocks to recover data associated with a corrupted or unreadable source data block. One such technique proposed by Microsoft® for its Azure® cloud-based platform is known as Local Repairable Code (LRC). LRC breaks the number of k source data blocks into smaller local groups to reduce network overhead. For LRC, only source data blocks stored to nodes in a local group are gathered to recover data from a source data block stored to a node in the local group.

Although LRC attempts to address network overhead it still suffers from another problem with using erasure coding based on (k, m). The other problem is that after data from a corrupted source data block is recovered, current solutions fail to provide an efficient or feasible mechanism to verify and validate if the recovered data is the same data that was originally stored in the corrupted source data block. Adding a source data block checksum does not resolve this problem because (1) compute resources for this type of checksum are costly to implement due to possibly large numbers of source data blocks; (2) a checksum is usually stored with a source data block and if the source data block is corrupted or unreadable then so is the checksum; (3) to add a whole data file or data object based checksum may incur an overall data file or data object traverse, traversing the overall data file also removes LRC as an option because the source data blocks are divided into groups.

FIG. 1 illustrates an example storage system 100. In some examples, as shown in FIG. 1, storage system 100 includes nodes 110-1 to 110-16 each having respective storage devices 112-1 to 112-16 (e.g., to store source data or parity blocks). Nodes 110-1 to 110-16 may be coupled in communication and/or interconnected via a network 105 through wired and/or wireless communication links. As described more below, a node such as node 110-1 may include logic and/or features to cause an erasure coding to be implemented to protect a data file or data object stored to a plurality of nodes of a network storage system such as storage system 100 in a plurality of source data blocks.

According to some examples, the erasure coding implemented by logic and/or features at a node may be based on a modification to an existing erasure code such as used with Vandermond Reed-Solomon erasure codes. For example, the modification may be for a (k, m) erasure code. As described more below, the modification may result in an erasure code of (k, r, p, m), where k represents source data blocks separately stored to nodes of storage system 100, r represents a number of local groups that separately include k/r source data blocks, p represents a number of local parity blocks separately stored to nodes of the storage system to separately protect the k/r source data blocks included in each local group and m represents a number of global parity blocks separately stored to nodes of the storage system to protect all k source data blocks.

In some examples, the modification starting with the (k, m) erasure code and using values of k=10 and m=4 for this erasure code means that 10 source data blocks will have 4 parity blocks to protect data included in the 10 source data blocks. The modification may include dividing the 10 source data blocks into two (r=2) local groups (or more if needed) and then encode each respective local group to generate two (p=2) local parity blocks in a (5, 2) local erasure code scheme yet also having two (m=2) global parity blocks for all 10 source data blocks in a (10, 2) global erasure code scheme. Thus, the resulting modification of (10, 4) becomes (10, 2, 2, 2) for (k, r, p, m). As described more below, recovery of data and verification of data may be completed in a manner that reduces network overhead compared to traditional Vandermond Reed-Solomon erasure codes and also uses substantially less storage overhead compared to triple replication.

According to some examples, as shown in FIG. 1, nodes 110-1 to 110-5 and 110-10 to 110-15 are depicted as including data. For these examples, logic and/or features at a node (e.g., node 110-1) may have caused an erasure code based on (10, 2, 2, 2) to be implemented. As part of this implementation, a data file or object file may have been partitioned in 10 (k) source data blocks and then stored to nodes included in 2 (r) local groups. For example, a first of the 2 local groups is shown in FIG. 1 as local group 120 and a second of the 2 local groups is shown as local group 130. Each local group includes (k/r) or 10/2=5 nodes to maintain source data blocks in respective storage device(s). Thus, as shown in FIG. 1, local group 120 includes nodes 110-1 to 110-5 and local group 130 includes nodes 110-10 to 110-14. Also, each local group has 2 (p) local parity blocks that may be separately stored to nodes of storage system 100. For example, as shown in FIG. 1, nodes 110-6 and 110-7 may store local parity (L. Parity) blocks for local group 120 to their respective storage device(s) 112-6 and 112-7 and nodes 110-15 and 110-16 may store local parity blocks for local group 130 to their respective storage device(s) 112-15 and 112-16. Also, 2 (m) global parity blocks to protect all 10 (k) source data blocks may be separately stored to nodes of storage system 100. For example, nodes 110-8 and 110-9 may store global parity (G. Parity) blocks to their respective storage device(s) 112-8 and 112-9.

In some examples, as a result of implementing an erasure coding scheme based on (10, 2, 2, 2) for (k, r, p, m) a total of 16 data source and parity blocks may be stored to nodes 110-1 to 110-16 as shown in FIG. 1. Storage of 16 data source and parity blocks is an increase in blocks to be stored to nodes compared to an erasure coding scheme based on (10, 4) for (k, m). However, as described more below, the modified erasure code based on (10, 2, 2, 2) for (k, r, p, m) may allow for data recovered from as many as four source data blocks to also be verified upon recovery.

In some examples, nodes 110-1 to 110-16 may be coupled in communication via network 105 in accordance with one or more protocols that may comply and/or be compatible with an remote direct memory access (RDMA) protocol such as Internet Wide Area RDMA protocol (iWARP), Infiniband (IB) protocol, Ethernet protocol, Transmission Control Protocol/Internet Protocol (TCP/IP) protocol and/or RDMA over Converged Ethernet (RoCE) protocol. For example, the iWARP protocol may comply and/or be compatible with Recio et al., "An RDMA Protocol Specification," Internet Draft Specification, Internet Engineering Task Force (IETF), 21 Oct. 2002. Also for example, the Ethernet protocol may comply and/or be compatible with Institute of Electrical and Electronics Engineers, Inc. (IEEE) Std. 802.3-2012, Carrier sense Multiple access with Collision Detection (CSMA/CD) Access Method and Physical Layer Specifications, Published in December 2012 (hereinafter "IEEE 802.3"). Additionally, for example, the TCP/IP protocol may comply and/or be compatible with the protocols described in Internet Engineering Task Force (IETF) Request For Comments (RFC) 791 and 793, published September 1981. Also, the IB protocol may comply and/or be compatible with Infiniband™ Architecture Specification, Vol. 2, Rel. 1.3, published November 2012. Additionally, for example, the RoCE protocol may comply and/or be compatible with Supplement to Infiniband Architecture Specification, Vol. 1, Rel. 1.2.1, Annex A16: "RDMA over Converged Ethernet (RoCE)", published April 2010. Many different, additional, and/or other protocols may be used for such data and/or command exchange without departing from these examples (e.g., earlier and/or later-developed versions of the aforesaid, related, and/or other protocols).

According to some examples, nodes 110-1 to 110-16 may include communication or storage interfaces (not shown) to store data associated with source data blocks or parity blocks to respective storage device(s) 112-1 to 112-16. For these examples, the communication or storage interfaces may be arranged as a Serial Advanced Technology Attachment (SATA) interface to couple a storage device in communication with a node. In another example, the communication or storage interfaces may be arranged as a Serial Attached Small Computer System Interface (SCSI) (or simply SAS) interface to a storage device in communication with a computing platform. In another example the communication or storage interfaces to couple a storage device in communication with a node. In another example, the communication or storage interfaces may be arranged as a Non-Volatile Memory Express (NVMe) interface to couple a storage device in communication with a node. For this other example, communication protocols may be utilized to communicate through these communication or storage interfaces as described in industry standards or specifications (including progenies or variants) such as the Peripheral Component Interconnect (PCI) Express Base Specification, revision 3.1, published in November 2014 ("PCI Express specification" or "PCIe specification") and/or the Non-Volatile Memory Express (NVMe) Specification, revision 1.2, also published in November 2014 ("NVMe specification").

In some examples, storage device(s) 110-1 to 110-16 may separately include various types and quantities of storage media or mediums (e.g., hard disk drives or solid state drives) including volatile types and/or non-volatile types of memory. Volatile types of memory may include, but are not limited to, random-access memory (RAM), Dynamic RAM (D-RAM), double data rate synchronous dynamic RAM (DDR SDRAM), static random-access memory (SRAM), Thyristor RAM (T-RAM) or zero-capacitor RAM (Z-RAM). Memory devices including volatile types of memory may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

According to some examples, non-volatile types of memory may be types of memory whose state is determinate even if power is interrupted to the device. In some examples, the non-volatile types of memory may include block addressable memory devices, such as those associated with NAND or NOR technologies. The non-volatile types of memory may also include chips or dies having other non-volatile types of memory such as 3-dimensional cross-point memory that are byte addressable. These block addressable or byte addressable non-volatile types of memory may include, but are not limited to, non-volatile types of memory that use chalcogenide phase change material (e.g., chalcogenide glass), multi-threshold level NAND flash memory, NOR flash memory, single or multi-level phase change memory (PCM), resistive memory, nanowire memory, ferroelectric transistor random access memory (FeTRAM), magnetoresistive random access memory (MRAM) memory that incorporates memristor technology, or spin transfer torque MRAM (STT-MRAM), or a combination of any of the above, or other non-volatile memory types.

According to some examples, nodes 110-1 to 110-16 may either individually or collectively include, but are not limited to, a server, a storage server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof.

Figure 2:
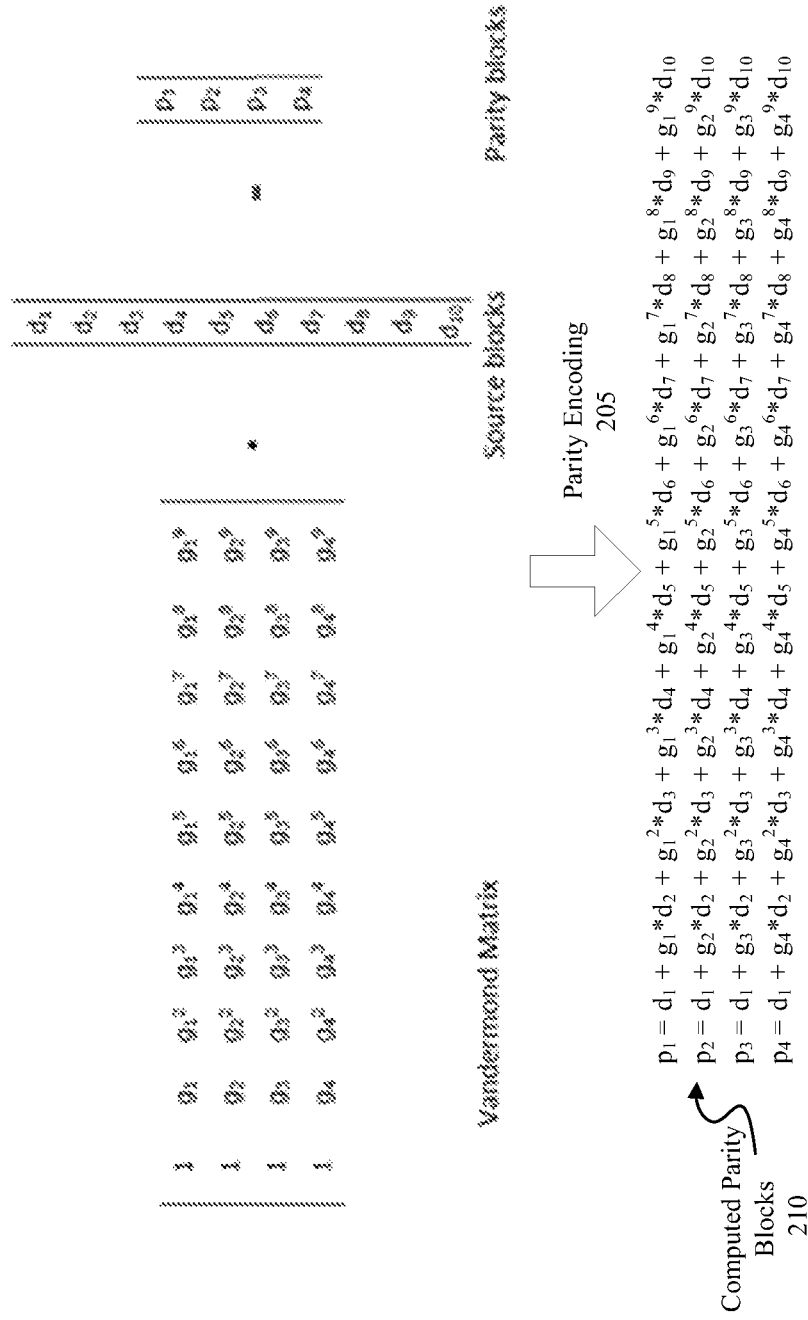
FIG. 2 illustrates an example erasure coding.

FIG. 2 illustrates an example erasure code 200. In some examples, erasure coding 200 depicts use of a Vandermond matrix for parity encoding 205 to generate computed parity blocks 210 for an erasure code based on (10, 4) for (k, r). As shown in FIG. 2, 10 source data blocks may be encoded to generate parity blocks $p_1$ to $p_4$ included in computed parity blocks 210. As described more below, 2 of the computed parity blocks 210 (e.g., $p_3$ and $p_4$) may be stored as global parity blocks to nodes of a storage system in order to protect source data blocks and for possible use in recovering data and/or verifying that data is correctly recovered. The other 2 computed parity blocks 210 (e.g., $p_1$ and $p_2$), although not stored, may still be computed based on local parity blocks and are also for possible use in recovering data and/or verifying that data is correctly recovered.

According to some examples, for parity encoding 205 to result in computed parity blocks 210, parity blocks $p_1$ to $p_4$ result from linear combinations of source data d, and a selection of Vandermond matrix coefficient $g_1$, $g_2$, $g_3$ and $g_4$ that may be flexible. For these examples, parity encoding 205 may include encoding operations based on a Galois Field of ($2^{10}$). Examples are not limited to a Galois Field of ($2^{10}$).

In some examples, use of computed parity blocks 210 may occur if it is determined that data included in up to at least four source data blocks is corrupt or unreadable. For these examples, a decoding of the computed parity blocks may include deleting rows of the Vandermond matrix, inverting it, and multiplying the inverse ($G^T$) by uncorrupted source data blocks. This process may be equivalent to solving a set of independent linear equations. A construction of $G^T$ from the Vandermond matrix ensure that a matrix inversion is successful.

Figure 3:
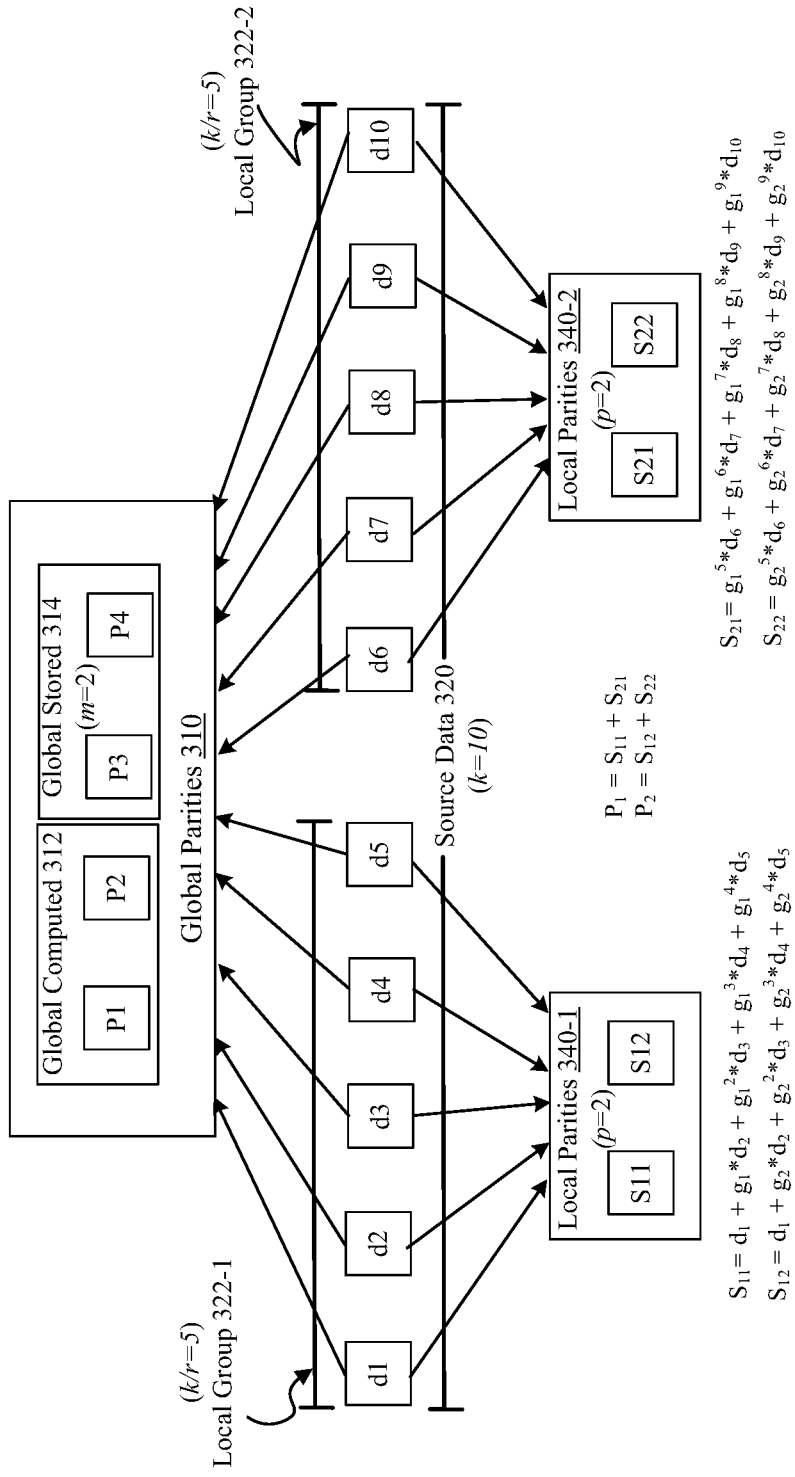
FIG. 3 illustrates an example erasure coding scheme.

FIG. 3 illustrates an example erasure coding scheme 300. In some examples, erasure encoding scheme 300 as shown in FIG. 3 illustrates an erasure coding scheme based on (10, 2, 2, 2) for (k, r, p, m). For these examples, erasure coding scheme 300 may be implemented by or using components or elements of storage system 100 shown in FIG. 1 such as nodes 110-1 to 110-16 coupled with respective storage device(s) 112-1 to 112-16 and interconnected through network 105. However, erasure coding scheme 300 is not limited to being implemented by or use only these component or elements of storage system 100.

In some examples, as shown in FIG. 3, erasure encoding scheme 300 based on (10, 2, 2, 2) for (k, r, p, m) includes global parities 310, source data 320 and local parities 340-1 and 340-2. For these examples, 10 (k=10) source data blocks d1 to d10 are included in source data blocks 320. These source data blocks may be stored to nodes of a storage system (e.g., nodes 110-1 to 110-5 and 110-10 to 110-14) and may represent portions of data for a data file or data object. Also for these examples, source data blocks 320 may be divided in 2 (r=2) local groups of 5 (k/r) source data blocks and included in local groups 322-1 and 322-2 as shown in FIG. 3.

According to some examples, 2 (p=2) local parities may be computed for each of the two local groups. For examples, local parities S11 and S12 of local parities 340-1 may be computed using source data blocks d1 to d5 to protect these data blocks in local group 322-1. Also, local parities S21 and S22 of local parities 340-2 may be computed using source data blocks d6 to d10 to protect these data blocks in local group 322-1. For these examples, a same Vandermond matrix coefficient used to generate computed parity blocks p1 and p2 that are shown in FIG. 2 as $g_1$ and $g_2$ may be used to generate S11, S12, S21 and S22. Once computed, the four parity blocks included in local parities 340-1 and 340-2 for S11, S12, S21 and S22 may be separately stored to nodes of the storage system (e.g., nodes 110-6, 110-7, 1110-15 and 110-16).

In some examples, although a total of 4 global parities may be computed, only 2 (m=2) global parities may be computed and stored to nodes included in the storage system (e.g., nodes 110-8 and 110-9). For these examples, as shown in FIG. 3, the 2 computed and stored global parities of P3 and P4 are included in global stored 314. Meanwhile the 2 computed but not stored global parities are included in global computed 312. As mentioned above, a same Vandermond matrix that was used to generate computed parity blocks p1 and p2 may be used to generate S11, S12, S21 and S22. As a result, as shown in FIG. 3, $P_1=S11+S_{21}$ and $P_2=S_{12}+S_{22}$. Therefore, since local parities 340-1 and 340-2 for S11, S12, S21 and S22 are arranged to be stored in separate nodes, P1 and P2 may be computed without a need to store as two separate global parity blocks. Since P1 and P2 are computed based on all 10 source data blocks these global parity blocks may be available for use as additional global parities as needed to recover and/or verify data in corrupted source data blocks.

According to some examples, the global parities of P3 and P4 included in global stored 314 may be separately stored as global parity blocks to nodes in the storage system. For these examples, a same Vandermond matrix coefficient used to generate computed parity blocks p3 and p4 that are shown in FIG. 2 as $g_3$ and $g_4$ may be used to generate P1 and P4 using all 10 of the source data blocks included in source data 320.

In some examples, erasure encoding scheme 300 based on (10, 2, 2, 2) for (k, r, p, m), as mentioned above, results in a total of 6 parity blocks to protect 10 source data blocks. Those 6 parity blocks including S11, S12, S21, S22, P3 and P4 results in a storage overhead of approximately 160% to protect a data file or data object stored to 10 source data blocks. A storage overhead of approximately 160% is substantially less storage overhead compared to triple replication that would require an overhead of approximately 300% (e.g., 30 blocks) to implement.

FIG. 4 illustrates an example table 400. In some examples, table 400 shows example data recovery and data verification possibilities based on a number of corrupted or unreadable source data blocks included in groups 320-1 and 320-2 shown in FIG. 3 for erasure coding scheme 300. As shown in FIG. 4 for table 400, data recovery is possible when up to four source data blocks are corrupted or readable. However, as described more below, for cases 6-8 only case 6 has a possibility of verifying that data was recovered correctly.

Figure 5:
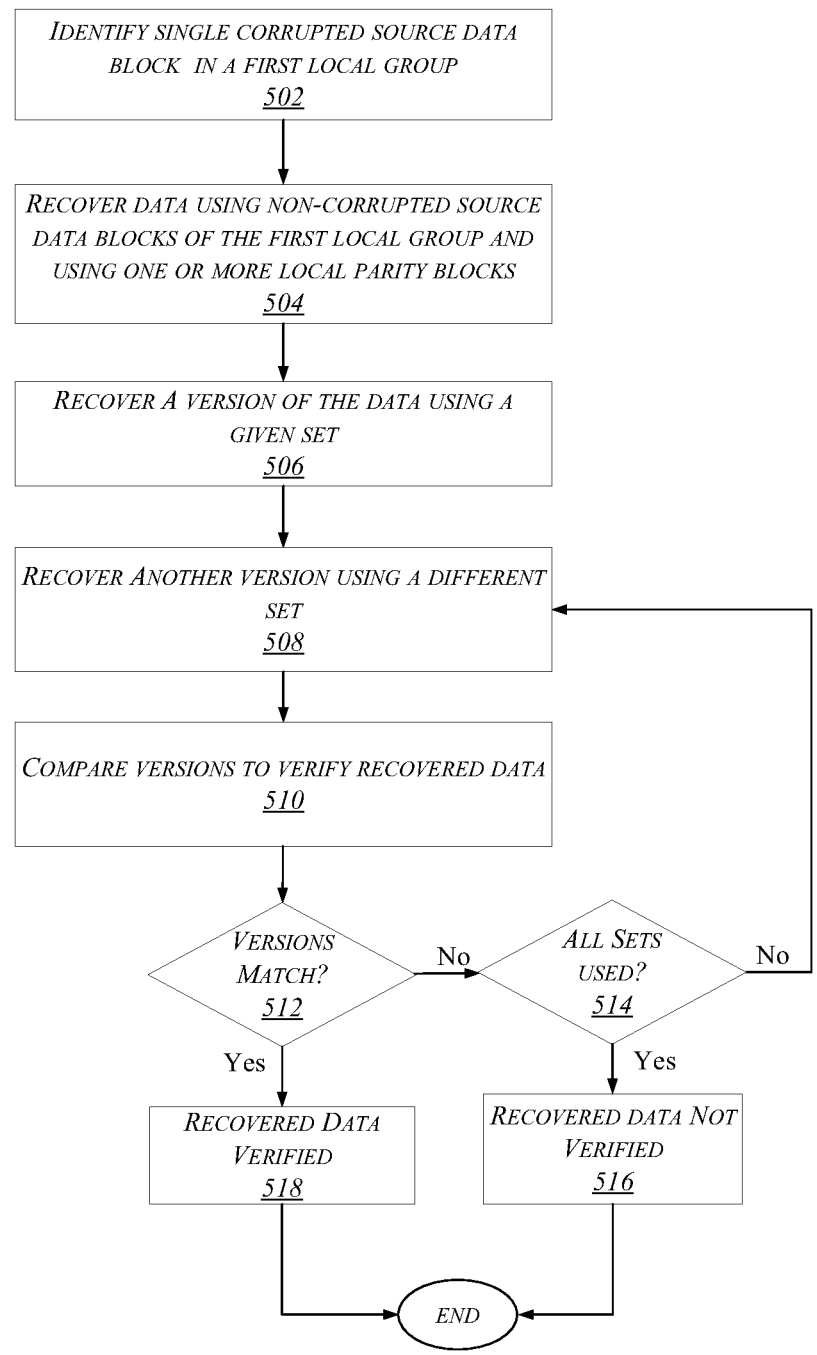
FIG. 5 illustrates an example first logic flow.

FIG. 5 illustrates an example logic flow 500. In some examples, logic flow 500 may be implemented by logic and/or features at a node such as a node from among nodes 110-1 to 110-16 for storage system 100 shown in FIG. 1. The node may be arranged to implement an erasure code similar to erasure code (10, 2, 2, 2) for (k, r, p, m) described above for encoding scheme 300 and mentioned for table 400 of FIG. 4. However, logic flow 500 is not limited to being implemented by elements of system 100 other elements such as storage management entities maintained with nodes not directly involved in or storing data or parity blocks may implement at least portions of logic flow 500.

Beginning at block 502, logic and/or features at the node may determine that a single source data block is corrupted or unreadable and may identify that the single corrupted source data block is part of a first local group. For example, the logic and/or features may receive an indication that a storage device associated with the node storing the source data block has failed or is not accessible. The node for example, may have stored source data block d1 included in local group 322-1 to the defective or inaccessible storage device.

At block 504, logic and/or features at the node may recover data using non-corrupted source data blocks of the first local group and using one or more local parity blocks. In some examples, the non-corrupted source data blocks may include d2-d5 and the local parity blocks include S11 and S12. For these examples, according to table 400, for cases 1 or 2, data may be recovered and verified for a single corrupted source data block in a local group. Therefore, following recovery of the data, the logic and/or features may attempt to verify that the recovered data was correctly recovered.

At block 506, logic and/or features at the node may recover a version of the data using a given set that includes at least three of the non-corrupted source data blocks included in the first local group and one or more local parity blocks. In some examples, a first version of the data may be recovered via use of a first set that includes at least three non-corrupted source data blocks from among d2-d5 and one or more of local parity blocks among S11 and S12.

At block 508, logic and/or features at the node may recover another version of the data using a different set. In some examples, the different set may include at least one source data block or local parity block that is different. For example, a second version of the data may be recovered via use of a second set that includes at least three non-corrupted source data blocks from among d2-d5 and one or more of local parity blocks among S11 and S12. For this example, the second set has at least one non-corrupted source data block or local parity block that is different than those blocks used for the first set.

At block 510, logic and/or features at the node may compare versions to verify recovered data. In some examples, the first version may be compared to the second version to verify the recovered data.

At decision block 512, logic and/or features at the node may determine whether the versions match. If the versions match, logic flow 500 moves to block 518. Otherwise, logic flow 500 moves to decision block 514.

At decision block 514, logic and/or features at the node may determine whether all possible sets of non-corrupted source data blocks and local parity blocks have been used for the first local group. If all possible sets have been used, logic flow 500 moves to block 516. Otherwise, logic flow 500 moves to block 508 and yet another set may be used to recover the data and then compare that recovered version with the first version.

At block 516, logic and/or features at the node may determine that the recovered data is not verified and logic flow 500 may come to an end.

At block 518, logic and/or features at the node may deem that the recovered data was correctly recovered and logic flow 500 comes to an end. This verification of recovered data for a single corrupted source data block using erasure code (10, 2, 2, 2) for (k, r, p, m) needed to read or obtain data/parity information for a total of six blocks that included the non-corrupted source data blocks and the local parity blocks. Needing to read six blocks is a substantial improvement over Vandermond Reed Solomon erasure codes which would have required at least 10 blocks to be read or obtained. Although, additional computations may be needed to verify recovery as mentioned for blocks 508 and 506, these additional computations may be implemented comparatively faster than obtaining the additional source data blocks from networked nodes. Also, less network overhead resulting from fewer accesses to nodes storing blocks may have a positive impact on the overall storage system's performance.

Figure 6:
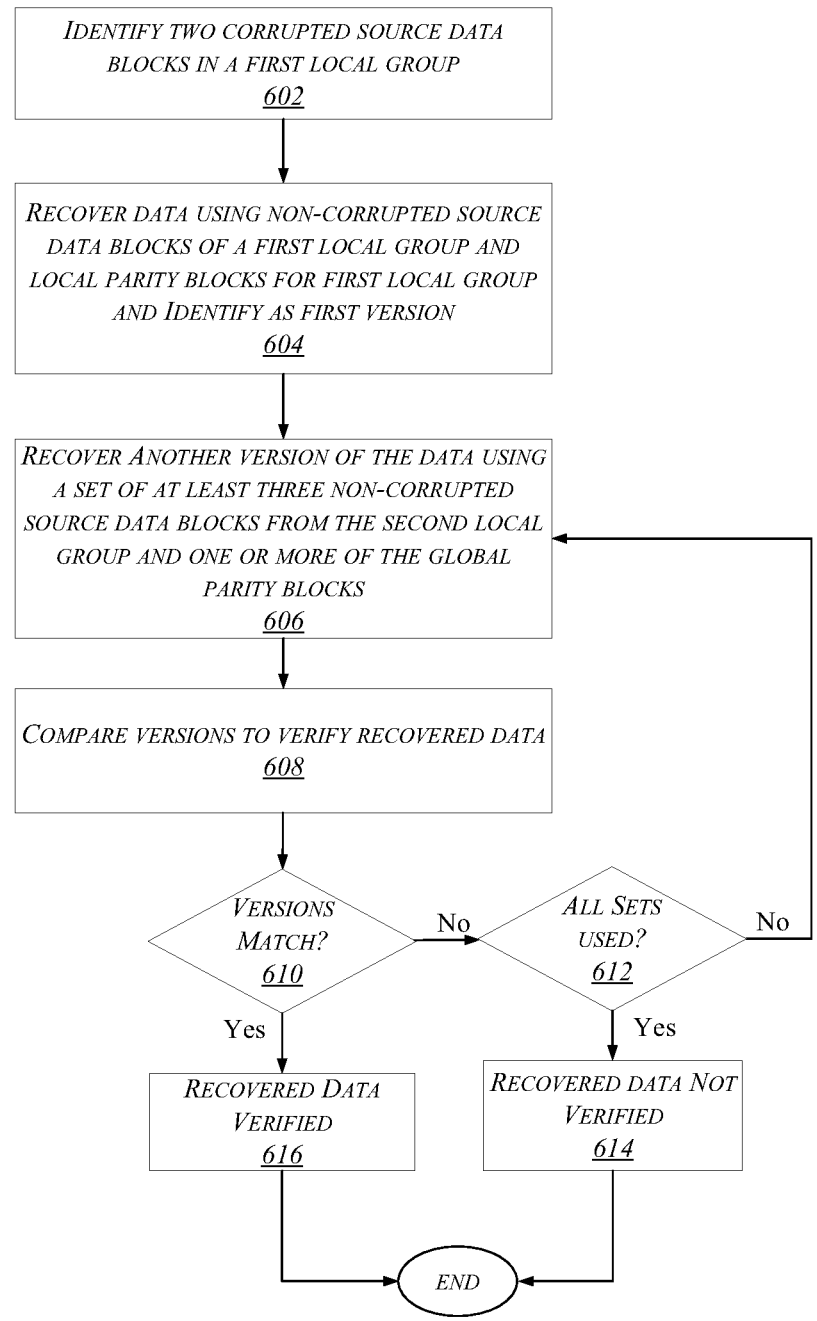
FIG. 6 illustrates an example second logic flow.

FIG. 6 illustrates an example logic flow 600. In some examples, logic flow 600 may be implemented by logic and/or features at a node such as a node from among nodes 110-1 to 110-16 for storage system 100 shown in FIG. 1. The node may be arranged to implement an erasure code similar to erasure code (10, 2, 2, 2) for (k, r, p, m) described above for encoding scheme 300 and mentioned for table 400 of FIG. 4. However, logic flow 600 is not limited to being implemented by elements of system 100 other elements such as storage management entities maintained with nodes not directly involved in or storing data or parity blocks may implement at least portions of logic flow 600.

Beginning at block 602, logic and/or features at the node may determine that two source data blocks are corrupted or unreadable and may identify that the two corrupted source data blocks are part of a first local group. For example, logic and/or features may receive an indication that storage device(s) associated with a node or nodes storing the source data blocks have failed or is not accessible. The node for example, may have stored source data blocks d1 and d2 included in local group 322-1 to the defective or inaccessible storage device(s).

At block 604, logic and/or features at the node may recover data using non-corrupted source data blocks of the first local group and using both local parity blocks and then identify this recovered data a first version. In some examples, the non-corrupted source data blocks may include d3-d5 and the local parity blocks include S11 and S12. For these examples, according to table 400, for case 3, data may be recovered and verified for two corrupted source data blocks in a local group. Therefore, following recovery of the data identified as the first version, the logic and/or features may attempt to verify that the recovered data was correctly recovered.

At block 606, logic and/or features at the node may recover another version of the data using a set of at least three non-corrupted source data blocks from the second local group and one or more of the global parity blocks. In some examples, another or second version of the data may be recovered via use of at least three non-corrupted source data blocks from among d6-d10 and one or more of global parity blocks among P3 and P4.

At block 608, logic and/or features at the node may compare versions to verify recovered data. In some examples, the first version may be compared to the second version. To verify the recovered data.

At decision block 610, logic and/or features at the node may determine whether the versions match. If the versions match, logic flow 600 moves to block 616. Otherwise, logic flow 600 moves to decision block 612.

At decision block 612, logic and/or features at the node may determine whether all possible sets of non-corrupted source data blocks and local parity blocks have been used for the from the second local group and the global parities. If all possible sets have been used, logic flow 600 moves to block 614. Otherwise, logic flow 600 moves to block 606 and yet another set may be used to recover the data and then compare that recovered version with the first version.

At block 614, logic and/or features at the node may determine that the recovered data is not verified and the logic flow 600 may come to an end.

At block 616, logic and/or features at the node may deem that the recovered data was correctly recovered and logic flow 600 comes to an end.

Figure 7:
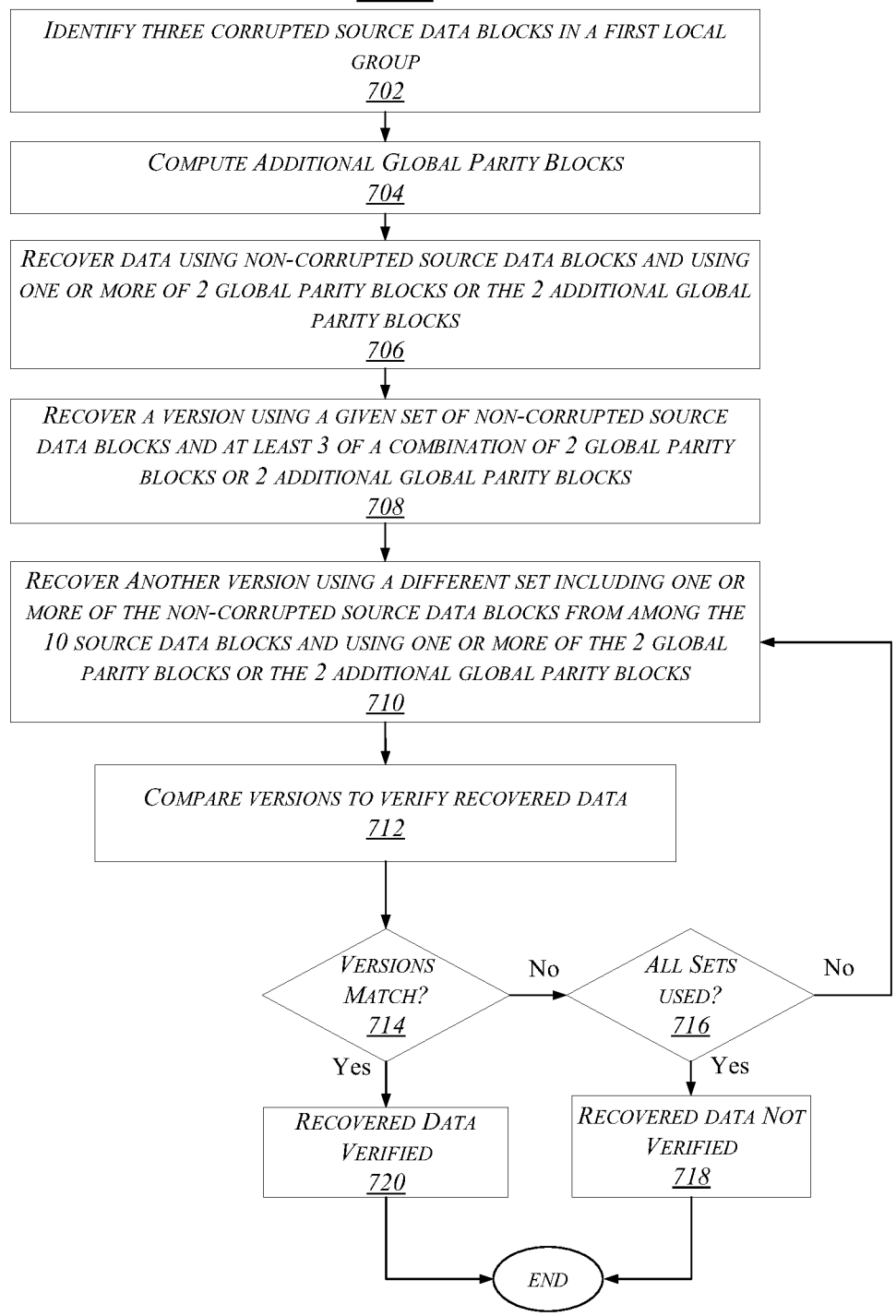
FIG. 7 illustrates an example third logic flow.

FIG. 7 illustrates an example logic flow 700. In some examples, logic flow 700 may be implemented by logic and/or features at a node such as a node from among nodes 110-1 to 110-16 for storage system 100 shown in FIG. 1. The node may be arranged to implement an erasure code similar to erasure code (10, 2, 2, 2) for (k, r, p, m) described above for encoding scheme 300 and mentioned for table 400 of FIG. 4. However, logic flow 700 is not limited to being implemented by elements of system 100 other elements such as storage management entities maintained with nodes not directly involved in or storing data or parity blocks may implement at least portions of logic flow 700.

Beginning at block 702, logic and/or features at the node may determine that three source data blocks are corrupted or unreadable and may identify that the three corrupted source data blocks are part of a first local group. For example, logic and/or features may receive an indication that storage device(s) associated with a node or nodes storing the source data blocks have failed or is not accessible. The node for example, may have stored source data blocks d1, d2 and d3 included in local group 322-1 to the defective or inaccessible storage device(s).

At block 704, logic and/or features at the node may compute additional global parity blocks. For these examples, the three corrupted source data blocks do not make it possible to recover and verify data for these source data blocks using only local parities and the stored global parities. Hence, additional global parity blocks for P1 and P2 may be computed to recover and verify recovered data.

At block 706, logic and/or features at the node may recover data included in the three corrupted source data blocks using non-corrupted source data blocks and using one or more of 2 global parity blocks (e.g., P3 or P4) or the 2 additional global parity blocks (e.g., P1 or P2). For these examples, according to table 400, for case 5, data may be recovered and verified for three corrupted source data blocks in a local group. Therefore, following recovery of the data, the logic and/or features may attempt to verify that the recovered data was correctly recovered.

At block 708, logic and/or features at the node may recover a version using a given set of non-corrupted source data blocks and at least 3 of a combination of 2 global parity blocks or 2 additional global parity blocks.

At block 710, logic and/or features at the node may recover another version using a different set including one or more of the non-corrupted source data blocks from among the 10 source data blocks and using one or more of the 2 global parity blocks or the 2 additional global parity blocks.

At block 712, logic and/or features at the node may compare versions to verify recovered data.

At decision block 714, logic and/or features at the node may determine whether the versions match. If the versions match, logic flow 700 moves to block 720. Otherwise, logic flow 700 moves to decision block 716.

At decision block 716, logic and/or features at the node may determine whether all possible sets of non-corrupted source data blocks from among the 10 source data blocks and using one or more of the 2 global parity blocks or the 2 additional global parity blocks have been used. If all possible sets have been used, logic flow 700 moves to block 718. Otherwise, logic flow 700 moves to block 710 and yet another set may be used to recover the data and then compare that recovered version with the first version.

At block 718, logic and/or features at the node may determine that the recovered data is not verified and the logic flow 700 may come to an end.

At block 720, logic and/or features at the node may deem that the recovered data was correctly recovered and logic flow 700 comes to an end.

Logic flows 500, 600 and 700 are examples of how up to three corrupted source data blocks belonging to a single local group may be recovered and verified when using erasure coding scheme 300. Other examples, including recovery and verification of other combinations of corrupted source data blocks in both local groups are contemplated as shown for cases 2, 4 and 6 of table 400 shown in FIG. 4. Also, cases 7 and 8 may allow for recovery but not verification. Examples for recovery and verification of case 2 may include implementation of logic flow 500 for both local groups. Examples for recover and verification for case 4 may include implementation of logic flow 500 for local group 320-2 and then implementation of logic flow 600 for local group 320-1. Examples for recover and verification for case 6 may include implementation of logic flow 500 for local group 320-1 and then implementation of logic flow 700 for logical group 320-2.

Figure 8:
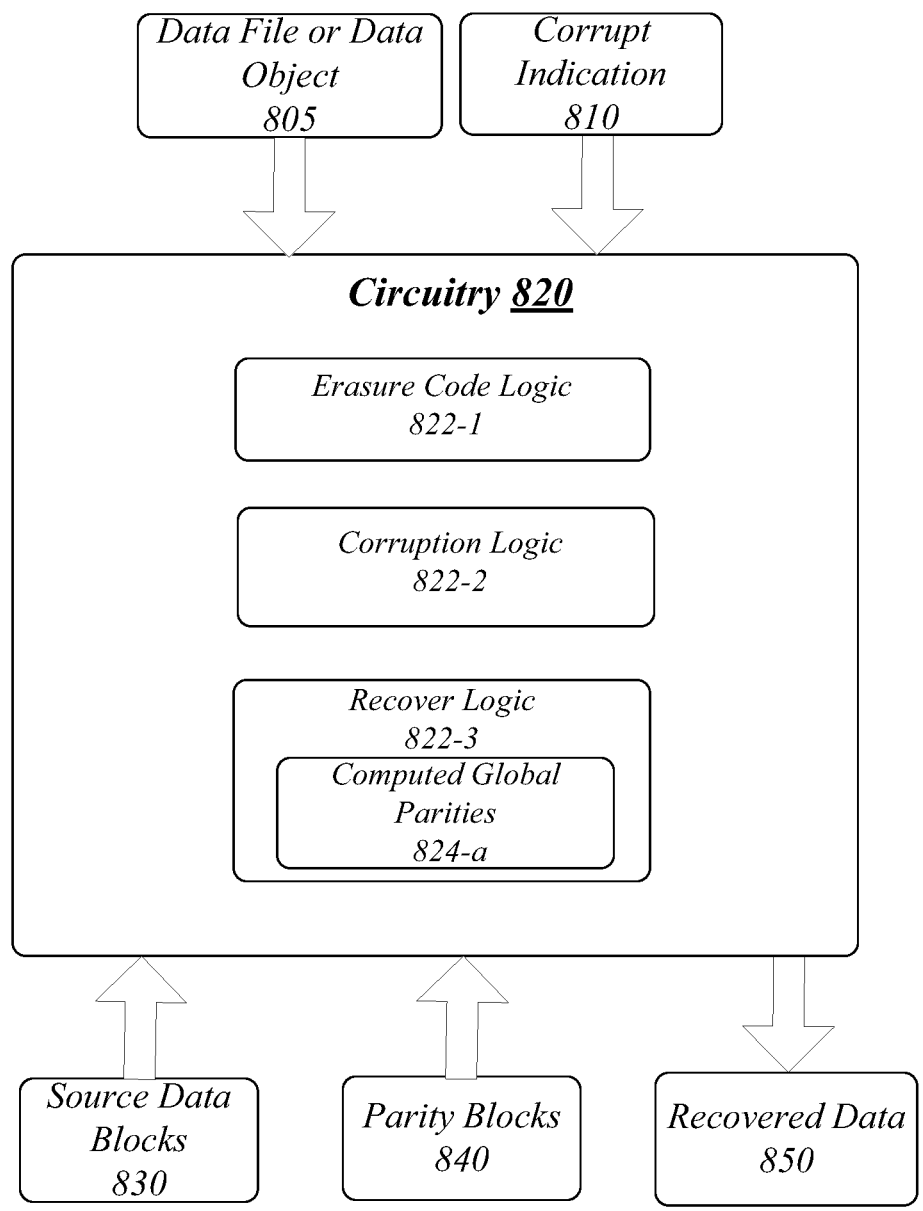
FIG. 8 illustrates an example block diagram for an apparatus.

FIG. 8 illustrates an example block diagram for an apparatus 800. Although apparatus 800 shown in FIG. 8 has a limited number of elements in a certain topology, it may be appreciated that the apparatus 800 may include more or less elements in alternate topologies as desired for a given implementation.

The apparatus 800 may be supported by circuitry 820 and apparatus 800 may be logic and/or features maintained at a node in a storage system such as storage system 100 shown in FIG. 1. Circuitry 820 may be arranged to execute one or more software or firmware implemented components, modules or logic 822-*a* (e.g., implemented, at least in part, by a processor at a node) that may encompass logic and/or features of a node as mentioned above. It is worthy to note that "a" and "b" and "c" and similar designators as used herein are intended to be variables representing any positive integer. Thus, for example, if an implementation sets a value for a=3, then a complete set of software or firmware for components, modules or logic 822-*a* may include components 822-1, 822-2 or 822-3. Also, these "components" or "logic" may be software/firmware a portion of which may be stored in computer-readable media, and although the components are shown in FIG. 8 as discrete boxes, this does not limit these components to storage in distinct computer-readable media components (e.g., a separate memory, etc.).

According to some examples, circuitry 820 may include a processor or processor circuitry. The processor or processor circuitry can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples circuitry 820 may also include one or more ASICs and at least some components 822-*a* may be implemented as hardware elements of these ASICs.

According to some examples, apparatus 800 may include an erasure code logic 822-1. Erasure code logic 822-1 may be a logic and/or feature executed by circuitry 820 to cause an erasure coding to be implemented to protect a data file or data object stored to a plurality of nodes of a storage system in a plurality of source data blocks. The erasure coding, for example, may be based on (k, r, p, m), where k represents source data blocks separately stored to nodes of the storage system, r represents a number of local groups that separately include k/r source data blocks, p represents a number of local parity blocks separately stored to nodes of the storage system to separately protect the k/r source data blocks included in each local group and m represents a number of global parity blocks separately stored to nodes of the storage system to protect all k source data blocks. For these examples, the data file or data object may be included in data file or data object 805.

In some examples, apparatus 800 may also include a corruption logic 822-2. Corruption logic 822-2 may be a logic and/or feature executed by circuitry 820 to determine that data included in one or more source data blocks is corrupted or unreadable. For these examples, corruption logic 822-2 may receive an indication via corrupt indication 810 that indicates that the one or more source data blocks are corrupted or unreadable.

According to some examples, apparatus 800 may also include a recover logic 822-3. Recover logic 822-3 may be a logic and/or feature executed by circuitry 820 to recover data included in the one or more corrupted data source data blocks via use of non-corrupted source data blocks with one or more local parity blocks or with one or more global parity blocks. For these examples, recover logic 822-3 may gather non-corrupted source data blocks (e.g., included in source data blocks 830) and parity blocks (e.g., included in parity blocks 840) in order to recover data included in the corrupted source data blocks. Recovered data 850 may include the recovered data that may then be stored in one or more different nodes in the storage system. Recover logic 822-3 may maintain computed global parities 824-*a* in a data structure such as a look up table to facilitate recovery of data. Recover logic 822-3 may also attempt to recover and verify whether the data was correctly recovered using an erasure coding scheme similar to erasure coding scheme 300 that may have a same or different number of corrupted source data blocks that may be recovered and/or verified.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 9 illustrates an example of a logic flow 900. Logic flow 900 may be representative of some or all of the operations executed by one or more logic, features, or devices described herein, such as apparatus 900. More particularly, logic flow 900 may be implemented by one or more of erasure code logic 822-1, corruption logic 822-2 or recover logic 822-3.

According to some examples, logic flow 900 at block 902 may implement, at a processor circuit, an erasure coding scheme for a storage system based on (k, r, p, m), where k represents source data blocks separately stored to nodes of the storage system, r represents a number of local groups separately including k/r source data blocks, p represents a number of local parity blocks separately stored to nodes of the storage system for protecting the k/r source data blocks included in each local group and m represents a number of global parity blocks separately stored to nodes of the storage system for protecting all k source data blocks. For these examples, erasure code logic 822-1 may implement the erasure coding scheme.

In some examples, logic flow 900 at block 904 may determine that data included in one or more source data blocks is corrupted or unreadable. For these examples, corruption logic 822-2 may make this determination.

According to some examples, logic flow 900 at block 906 may recover data included in the one or more corrupted source data blocks using non-corrupted source data blocks and one or more local parity blocks or using one or more global parity blocks. For these examples, recover logic 822-3 may recover the data.

FIG. 10 illustrates an example of a first storage medium. As shown in FIG. 10, the first storage medium includes a storage medium 1000. The storage medium 1000 may comprise an article of manufacture. In some examples, storage medium 1000 may include any non-transitory computer readable medium or machine readable medium, such as an optical, magnetic or semiconductor storage. Storage medium 1000 may store various types of computer executable instructions, such as instructions to implement logic flow 900. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 11:
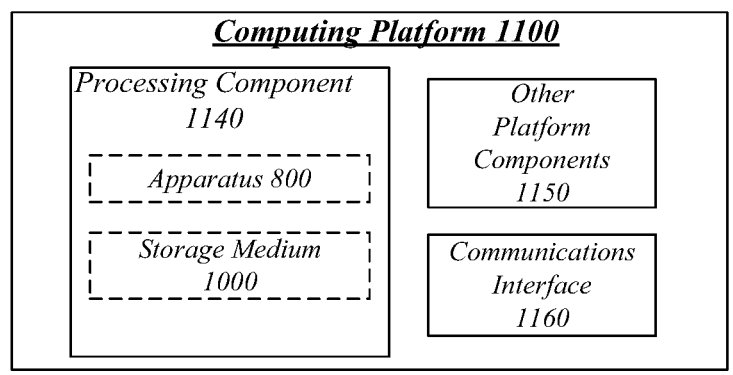
FIG. 11 illustrates an example computing platform.

FIG. 11 illustrates an example computing platform 1100. In some examples, as shown in FIG. 11, computing platform 1100 may include a processing component 1140, other platform components 1150 or a communications interface 1160. According to some examples, computing platform 1100 may be a node included in storage system such as storage system 100 shown in FIG. 1.

According to some examples, processing component 1140 may execute processing operations or logic for apparatus 800 and/or storage medium 1000. Processing component 1140 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, device drivers, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1150 may include common computing elements, such as one or more processors, multi-core processors, co-processors, memory units, chipsets, controllers, peripherals, interfaces, oscillators, timing devices, video cards, audio cards, multimedia input/output (I/O) components (e.g., digital displays), power supplies, and so forth. Examples of memory units may include without limitation various types of computer readable and machine readable storage media in the form of one or more higher speed memory units, such as read-only memory (ROM), RAM, DRAM, DDR-RAM), SDRA, SRAM, programmable ROM (PROM), erasable programmable ROM (EPROM), EEPROM, flash memory, polymer memory such as ferroelectric polymer memory, ovonic memory, phase change or ferroelectric memory, SONOS memory, magnetic or optical cards, an array of devices such as Redundant Array of Independent Disks (RAID) drives, solid state memory devices (e.g., USB memory), solid state drives (SSD) and any other type of storage media suitable for storing information.

In some examples, communications interface 1160 may include logic and/or features to support a communication interface. For these examples, communications interface 1160 may include one or more communication interfaces that operate according to various communication protocols or standards to communicate over direct or network communication links Direct communications may occur via use of communication protocols or standards described in one or more industry standards (including progenies and variants) such as those associated with the PCIe or the NVMe specifications. Network communications may occur via use of communication protocols or standards related to IEEE 802.3, iWARP, Infiniband, RoCE, SATA, SCSI, SAS. Network communication may also occur according to one or more OpenFlow specifications such as the OpenFlow Hardware Abstraction API Specification.

Computing platform 1100 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1100 described herein, may be included or omitted in various embodiments of computing platform 1100, as suitably desired.

The components and features of computing platform 1100 may be implemented using any combination of discrete circuitry, ASICs, logic gates and/or single chip architectures. Further, the features of computing platform 1100 may be implemented using microcontrollers, programmable logic arrays and/or microprocessors or any combination of the foregoing where suitably appropriate. It is noted that hardware, firmware and/or software elements may be collectively or individually referred to herein as "logic", "feature", "circuit" or "circuitry."

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The follow examples pertain to additional examples of technologies disclosed herein.

Example 1

An example apparatus may include an erasure code logic, at least a portion of which is in hardware. The erasure code logic may cause an erasure coding to be implemented to protect a data file or data object stored to a plurality of nodes of a networked storage system in a plurality of source data blocks. The erasure coding may be based on (k, r, p, m), where k represents source data blocks separately stored to nodes of the networked storage system, r represents a number of local groups that separately include k/r source data blocks, p represents a number of local parity blocks separately stored to nodes of the networked storage system to separately protect the k/r source data blocks included in each local group and m represents a number of global parity blocks separately stored to nodes of the networked storage system to protect all k source data blocks. The apparatus may also include a corruption logic, at least a portion of which is in hardware, the corruption logic to determine that data included in one or more source data blocks is corrupted or unreadable. The apparatus may also include a recover logic, at least a portion of which is in hardware, the recover logic to recover data included in the one or more corrupted source data blocks via use of non-corrupted source data blocks with one or more local parity blocks or with one or more global parity blocks.

Example 2

The apparatus of example 1, the recover logic to verify that recovered data was correctly recovered. For this example the recover logic to verify recovered data was correctly recovered includes the recover logic to recover a first version of the data using a first set that includes one or more non-corrupted source data blocks, one or more local parity blocks or one or more global parity blocks. The recover logic may also recover a second version of the data using a second set that includes one or more non-corrupted source data blocks, one or more local parity blocks or one or more global parity blocks, at least one non-corrupted source data block, local parity block or global parity block is different for blocks included in the first set compared to blocks included in the second set. The recover logic may also compare the first version with the second version. The recover logic may also determine the recovered data was correctly recovered if the first version matches the second version.

Example 3

The apparatus of example 2, the recover logic may determine the first version of the data does not match the second version of the data. For this example the recover logic to verify that recovered data was correctly recovered may further include the recover logic to recover a third version of the data via use of a third set that includes one or more non-corrupted source data blocks, one or more local parity blocks or one or more global parity blocks, at least one non-corrupted source data block, local parity block or global parity block is different for blocks included in both the first and second sets compared to blocks included in the third set. The recover logic may then compare the first version with the third version and determine the recovered data was correctly recovered if the first version matches the third version.

Example 4

The apparatus of example 1, the erasure code logic may cause the erasure code to be implemented via use of values of k=10, r=2, p=2 and m=2 for the erasure code. For this example the local and global parity blocks may be computed based on a Vandermond matrix and a Galois field of $(2^{10})$.

Example 5

The apparatus of example 4, the corruption logic may determine that data included in a single source data block is corrupted or unreadable. For this example the recover logic to recover data included in the single corrupted source data block includes the recover logic to identify that the single corrupted source data block is included in a first local group from among the 2 local groups that includes k/r or 5 source data blocks. The recover logic may also recover data included in the single corrupted source data block via use of non-corrupted source data blocks included in the first local group and use of one or more of the 2 local parity blocks protecting the 5 source data blocks in the first local group. The recover logic may also verify that recovered data was correctly recovered. In order to verify the data was correctly recovered the recover logic may recover a first version of the data via use of a first set that includes at least three of the non-corrupted source data blocks and one or more of the local parity blocks. The recover logic may also recover a second version of the data via use of a second set that includes at least three of the non-corrupted source data blocks and one or more local parity blocks, at least one non-corrupted source data block or local parity block is different for blocks included in the first set compared to blocks included in the second set. The recover logic may also compare the first version with the second version and determine the recovered data was correctly recovered if the first version matches the second version.

Example 6

The apparatus of example 5, the recover logic may determine the first version of the data does not match the second version of the data. For this example the recover logic to verify that recovered data was correctly recovered may further include the recover logic to recover a third version of the data via use of a third set that includes at least three of the non-corrupted source data blocks and one or more local parity blocks, at least one non-corrupted source data block or local parity block is different for blocks included in both the first and second sets compared to blocks included in the third set. The recover logic may also compare the first version with the third version and determine the recovered data was correctly recovered if the first version matches the third version.

Example 7

The apparatus of example 4 may also include the corruption logic to determine that data included in two source data blocks is corrupted or unreadable. For this example the recover logic to recover data included in the two corrupted source data blocks may include the recover logic to identify that the two corrupted source data blocks are included in a first local group from among the 2 local groups that includes k/r or 5 source data blocks. The recover logic may also recover the data included in the two corrupted source data blocks via use of non-corrupted source data blocks included in the first local group and the 2 local parity blocks protecting the 5 source data blocks in the first local group. The recover logic may also verify that recovered data was correctly recovered. The recover logic may also verify the data was correctly recovered by identifying that the data recovered via use of non-corrupted source data blocks included in the first local group and use of one or more of the local parity blocks protecting the 5 source data blocks in the first local group as a first version of the data. The recover logic may also recover a second version of the data via use of a first set that includes at least three non-corrupted source data blocks from among the 10 source data blocks not included in the first local group and use of one or more of the 2 global parity blocks protecting all 10 source data blocks. The recover logic may also compare the first version with the second version and may determine the recovered data was correctly recovered if the first version matches the second version.

Example 8

The apparatus of example 7, the recover logic may determine the first version of the data does not match the second version of the data. For this example the recover logic may verify that recovered data was correctly recovered by the recover logic recovering a third version of the data via use of a second set that includes at least three of the non-corrupted source data blocks from among the 10 source data blocks not included in the first local group and use of one or more of the 2 global parity blocks protecting all 10 source data blocks, at least one non-corrupted source data block or global parity block is different for blocks included in both the first set compared to blocks included in the third set. The recover logic may also compare the first version with the third version and may determine the recovered data was correctly recovered if the first version matches the third version.

Example 9

The apparatus of example 4, the corruption logic may determine that data included in three source data blocks is corrupted or unreadable. For this example the recover logic to recover data included the three corrupted source data blocks may include the recover logic to identify that the three corrupted source data blocks are included in a first local group from among the 2 local groups that includes k/r or 5 source data blocks. The recover logic may also compute k/r or 2 additional global parity blocks based on 2 local parity blocks for each of the 2 local groups. The recover logic may also recover data included in the three corrupted source data blocks vi use of non-corrupted source data blocks from among the 10 source data blocks and use of one or more of the 2 global parity blocks or the 2 additional global parity blocks. The recover logic may also verify that recovered data was correctly recovered. For the recover logic to verify the data was correctly recovered includes the recover logic to recover a first version of the data via use of a first set that include one or more non-corrupted source data blocks from among the 10 source data blocks and use at least 3 of a combination of the 2 global parity blocks or the 2 additional global parity blocks. The recover logic may also recover a second version of the data via use of a second set that includes one or more of the non-corrupted source data blocks from among the 10 source data blocks and using one or more of the 2 global parity blocks or the 2 additional global parity blocks, at least one non-corrupted source data block or global parity block is different for blocks included in the first set compared to blocks included in the second set. The recover logic may also compare the first version with the second version and may determine the recovered data was correctly recovered if the first version matches the second version.

Example 10

The apparatus of example 9, the recover logic may determine the first version of the data does not match the second version of the data. For this example the recover logic to verify that recovered data was correctly recovered may include the recover logic to recover a third version of the data via use of a third set that includes one or more of the non-corrupted source data blocks from among the 10 source data blocks and use of one or more of the 2 global parity blocks or the 2 additional global parity blocks, at least one non-corrupted source data block or global parity block is different for blocks included in both the first and second sets compared to blocks included in the third set. The recover logic may also compare the first version with the third version and may determine the recovered data was correctly recovered if the first version matches the third version.

Example 11

The apparatus of example 4, the corruption logic may determine that data included in four source data blocks is corrupted or unreadable. For this example the recover logic to recover data included the four corrupted source data blocks may include the recover logic to identify that one of the four corrupted source data blocks is included in a first local group from among the 2 local groups that includes k/r or 5 source data blocks. The recover logic may also recover data included in the single corrupted source data block via use of non-corrupted source data blocks included in the first local group and use of one or more of the 2 local parity blocks protecting the 5 source data blocks in the first local group. The recover logic may also verify that data recovered from the one corrupted source data block was correctly recovered. For the recover logic to verify the data was correctly recovered may include the recover logic to recover a first version of the data recovered from the one corrupted source data block via use of a first set that includes one or more of the non-corrupted source data blocks and one or more of the local parity blocks. The recover logic may also recover a second version of the data recovered from the one corrupted source data block via use of a second set that includes one or more of the non-corrupted source data blocks and one or more local parity blocks, at least one non-corrupted source data block or local parity block is different for blocks included in the first set compared to blocks included in the second set. The recover logic may also compare the first version of the data recovered from the one corrupted source data block with the second version of the data recovered from the one corrupted source data block. The recover logic may also determine the recovered data recovered from the one corrupted data source data block was correctly recovered if the first version of the data recovered from the one corrupted source data block matches the second version of the data recovered from the one corrupted source data block. The recover logic may also identify that the remaining three corrupted source data blocks are included in a second local group from among the 2 local groups that includes k/r or 5 source data blocks. The recover logic may also compute 2 additional global parity blocks based on 2 local parity blocks for each of the 2 local groups. The recover logic may also recover data included in the three corrupted source data blocks via use of non-corrupted source data blocks from among the 5 source data blocks and use of at least 3 of a combination of the 2 global parity blocks or the 2 additional global parity blocks. The recover logic may also verify that data recovered from the three corrupted source data blocks correctly recovered. For the recover logic to verify the data was correctly recovered may include the recover logic to recover a first version of the data recovered from the three corrupted source data blocks via use of a third set that includes one or more non-corrupted source data blocks from among the 10 source data blocks and use of one or more of the 2 global parity blocks or the 2 additional global parity blocks. The recover logic may also recover a second version of the data recovered from the three corrupted source data blocks via use of a fourth set that includes one or more of the non-corrupted source data blocks from among the 10 source data blocks and use of one or more of the 2 global parity blocks or the 2 additional global parity blocks, at least one non-corrupted source data block or global parity block is different for blocks included in the third set compared to blocks included in the fourth set. The recover logic may also compare the first version of data recovered from the three corrupted source data blocks with the second version data recovered from the three corrupted source data blocks. The recover logic may also determine the recovered data was correctly recovered if the first version data recovered from the three corrupted source data blocks matches the second version data recovered from the three corrupted source data blocks.

Example 12

The apparatus of example 4, the corruption logic may determine that data included in four source data blocks is corrupted or unreadable. For this example the recover logic to recover data included the four source data blocks may include the recover logic to identify that the four corrupted source data blocks are included in a first local group from among the 2 local groups that includes k/r or 5 source data blocks. The recover logic may also compute k/r or 2 additional global parity blocks based on 2 local parity blocks for each of the 2 local groups. The recover logic may also recover data included in the four corrupted source data blocks via use of non-corrupted source data blocks from among the 10 source data blocks, the 2 global parity blocks and the 2 additional global parity blocks.

Example 13

The apparatus of example 1, the networked storage system may include non-volatile or volatile types of memory, the non-volatile types of memory may include 3-dimensional cross-point memory, memory that uses chalcogenide phase change material, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

Example 14

An example method may include implementing, at a processor circuit, an erasure coding scheme for a networked storage system based on (k, r, p, m), where k represents source data blocks separately stored to nodes of the networked storage system, r represents a number of local groups separately including k/r source data blocks, p represents a number of local parity blocks separately stored to nodes of the networked storage system for protecting the k/r source data blocks included in each local group and m represents a number of global parity blocks separately stored to nodes of the networked storage system for protecting all k source data blocks. The method may also include determining that data included in one or more source data blocks is corrupted or unreadable. The method may also include recovering data included in the one or more corrupted source data blocks using non-corrupted source data blocks and one or more local parity blocks or using one or more global parity blocks.

Example 15

The method of example 14 may also include verifying that recovered data was correctly recovered by recovering a first version of the data using a first set including one or more non-corrupted source data blocks, one or more local parity blocks or one or more global parity blocks. The method may also include recovering a second version of the data using a second set including one or more non-corrupted source data blocks, one or more local parity blocks or one or more global parity blocks, at least one non-corrupted source data block, local parity block or global parity block is different for blocks included in the first set compared to blocks included in the second set. The method may also include comparing the first version with the second version determining the recovered data was correctly recovered if the first version matches the second version.

Example 16

The method of example 15, the first version of the data not matching the second version of the data. For this example verifying that recovered data was correctly recovered may further include recovering a third version of the data using a third set including one or more non-corrupted source data blocks, one or more local parity blocks or one or more global parity blocks, at least one non-corrupted source data block, local parity block or global parity block is different for blocks included in both the first and second sets compared to blocks included in the third set. The method may also include comparing the first version with the third version and determining the recovered data was correctly recovered if the first version matches the third version.

Example 17

The method of example 14 may also include implementing the erasure coding scheme with k=10, r=2, p=2 and m=2. The local and global parity blocks may be computed based on a Vandermond matrix and a Galois field of $(2^{10})$.

Example 18

The method of example 17 may also include determining that data included in a single source data block is corrupted or unreadable. For this example recovering data included in the single corrupted source data block may include identifying that the single corrupted source data block is included in a first local group from among the 2 local groups that includes k/r or 5 source data blocks. The method may also include recovering data included in the single corrupted source data block using non-corrupted source data blocks included in the first local group and using one or more of the 2 local parity blocks protecting the 5 source data blocks in the first local group. The method may also include verifying that recovered data was correctly recovered by recovering a first version of the data using a first set including at least three of the non-corrupted source data blocks and one or more of the local parity blocks. The method may also include recovering a second version of the data using a second set including at least three of the non-corrupted source data blocks and one or more local parity blocks, at least one non-corrupted source data block or local parity block is different for blocks included in the first set compared to blocks included in the second set. The method may also include comparing the first version with the second version. The method may also include determining the recovered data was correctly recovered if the first version matches the second version.

Example 19

The method of example 18, the first version of the data not matching the second version of the data. For this example verifying that recovered data was correctly recovered may further include recovering a third version of the data using a third set including at least three of the non-corrupted source data blocks and one or more local parity blocks, at least one non-corrupted source data block or local parity block is different for blocks included in both the first and second sets compared to blocks included in the third set. The method may also include comparing the first version with the third version. The method may also include determining the recovered data was correctly recovered if the first version matches the third version.

Example 20

The method of example 17 may also include determining that data included in two source data blocks is corrupted or unreadable. For this example recovering data included in the two corrupted source data blocks may include identifying that the two corrupted source data blocks are included in a first local group from among the 2 local groups that includes k/r or 5 source data blocks. The method may also include recovering the data included in the two corrupted source data blocks using non-corrupted source data blocks included in the first local group and the 2 local parity blocks protecting the 5 source data blocks in the first local group. The method may also include verifying that recovered data was correctly recovered by. The method may also include identifying the data recovered using non-corrupted source data blocks included in the first local group and using one or more of the local parity blocks protecting the 5 source data blocks in the first local group as a first version of the data. The method may also include recovering a second version of the data using a first set including at least three non-corrupted source data blocks from among the 10 source data blocks not included in the first local group and using one or more of the 2 global parity blocks protecting all 10 source data blocks. The method may also include comparing the first version with the second version and determining the recovered data was correctly recovered if the first version matches the second version.

Example 21

The method of example 20, the first version of the data not matching the second version of the data. For this example verifying that recovered data was correctly recovered may further include recovering a third version of the data using a second set including at least three of the non-corrupted source data blocks from among the 10 source data blocks not included in the first local group and using one or more of the 2 global parity blocks protecting all 10 source data blocks, at least one non-corrupted source data block or global parity block is different for blocks included in both the first set compared to blocks included in the third set. The method may also include comparing the first version with the third version. The method may also include determining the recovered data was correctly recovered if the first version matches the third version.

Example 22

The method of example 17 may also include determining that data included in three source data blocks is corrupted or unreadable. For this example recovering data included the three source data blocks may include identifying that the three corrupted source data blocks are included in a first local group from among the 2 local groups that includes k/r or 5 source data blocks. The method may also include computing k/r or 2 additional global parity blocks based on 2 local parity blocks for each of the 2 local groups. The method may also include recovering data included in the three corrupted source data blocks using non-corrupted source data blocks from among the 10 source data blocks and using one or more of the 2 global parity blocks or the 2 additional global parity blocks. The method may also include verifying that recovered data was correctly recovered by recovering a first version of the data using a first set including one or more non-corrupted source data blocks from among the 10 source data blocks and using at least 3 of a combination of the 2 global parity blocks or the 2 additional global parity blocks. The method may also include recovering a second version of the data using a second set including one or more of the non-corrupted source data blocks from among the 10 source data blocks and using one or more of the 2 global parity blocks or the 2 additional global parity blocks, at least one non-corrupted source data block or global parity block is different for blocks included in the first set compared to blocks included in the second set. The method may also include comparing the first version with the second version. The method may also include determining the recovered data was correctly recovered if the first version matches the second version.

Example 23

The method of example 21, the first version of the data not matching the second version of the data. For this example verifying that recovered data was correctly recovered may further include recovering a third version of the data using a third set including one or more of the non-corrupted source data blocks from among the 10 source data blocks and using one or more of the 2 global parity blocks or the 2 additional global parity blocks, at least one non-corrupted source data block or global parity block is different for blocks included in both the first and second sets compared to blocks included in the third set. The method may also include comparing the first version with the third version and determining the recovered data was correctly recovered if the first version matches the third version.

Example 24

The method of example 17 may also include determining that data included in four source data blocks is corrupted or unreadable. For this example recovering data included the four corrupted source data blocks includes identifying that one of the four corrupted source data blocks is included in a first local group from among the 2 local groups that includes k/r or 5 source data blocks. The method may also include recovering data included in the single corrupted source data block using non-corrupted source data blocks included in the first local group and using one or more of the 2 local parity blocks protecting the 5 source data blocks in the first local group. The method may also include verifying that data recovered from the one corrupted source data block was correctly recovered by recovering a first version of the data recovered from the one corrupted source data block using a first set including one or more of the non-corrupted source data blocks and one or more of the local parity blocks. The method may also include recovering a second version of the data recovered from the one corrupted source data block using a second set including one or more of the non-corrupted source data blocks and one or more local parity blocks, at least one non-corrupted source data block or local parity block is different for blocks included in the first set compared to blocks included in the second set. The method may also include comparing the first version of the data recovered from the one corrupted source data block with the second version of the data recovered from the one corrupted source data block. The method may also include determining the recovered data recovered from the one corrupted data source data block was correctly recovered if the first version of the data recovered from the one corrupted source data block matches the second version of the data recovered from the one corrupted source data block. The method may also include identifying that the remaining three corrupted source data blocks are included in a second local group from among the 2 local groups that includes k/r or 5 source data blocks. The method may also include computing 2 additional global parity blocks based on 2 local parity blocks for each of the 2 local groups. The method may also include recovering data included in the three corrupted source data blocks using non-corrupted source data blocks from among the 5 source data blocks and using at least 3 of a combination of the 2 global parity blocks or the 2 additional global parity blocks. The method may also include verifying that data recovered from the three corrupted source data blocks correctly recovered by recovering a first version of the data recovered from the three corrupted source data blocks using a third set including one or more non-corrupted source data blocks from among the 10 source data blocks and using one or more of the 2 global parity blocks or the 2 additional global parity blocks. The method may also include recovering a second version of the data recovered from the three corrupted source data blocks using a fourth set including one or more of the non-corrupted source data blocks from among the 10 source data blocks and using one or more of the 2 global parity blocks or the 2 additional global parity blocks, at least one non-corrupted source data block or global parity block is different for blocks included in the third set compared to blocks included in the fourth set. The method may also include comparing the first version of data recovered from the three corrupted source data blocks with the second version data recovered from the three corrupted source data blocks. The method may also include determining the recovered data was correctly recovered if the first version data recovered from the three corrupted source data blocks matches the second version data recovered from the three corrupted source data blocks.

Example 25

The method of example 17 may also include determining that data included in four source data blocks is corrupted or unreadable. For this example recovering data included the four corrupted source data blocks may include identifying that the four corrupted source data blocks are included in a first local group from among the 2 local groups that includes k/r or 5 source data blocks. The method may also include computing k/r or 2 additional global parity blocks based on 2 local parity blocks for each of the 2 local groups. The method may also include recovering data included in the four corrupted source data blocks using non-corrupted source data blocks from among the 10 source data blocks, the 2 global parity blocks and the 2 additional global parity blocks.

Example 26

The method of example 14, the networked storage system may include non-volatile or volatile types of memory. For this example the non-volatile types of memory may include 3-dimensional cross-point memory, memory that uses chalcogenide phase change material, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

Example 27

An example at least one machine readable medium may include a plurality of instructions that in response to being executed by a system cause the system to carry out a method according to any one of examples 14 to 26.

Example 28

An apparatus may include means for performing the methods of any one of examples 14 to 26.

Example 29

An example system may include at least one processor for a node of a networked storage system. The system may also include a storage device coupled with the node to store at least a portion of a data file or object stored to a plurality of nodes of a networked storage system in a plurality of source data blocks. The system may also include an erasure code logic, at least a portion of which is executed by the at least one processor, the erasure code logic to cause an erasure coding to be implemented to protect the data file or data object stored to the plurality of nodes of the networked storage system. The erasure coding based on (k, r, p, m), where k represents source data blocks separately stored to nodes of the networked storage system, r represents a number of local groups that separately include k/r source data blocks, p represents a number of local parity blocks separately stored to nodes of the networked storage system to separately protect the k/r source data blocks included in each local group and m represents a number of global parity blocks separately stored to nodes of the networked storage system to protect all k source data blocks. The system may also include a corruption logic, at least a portion of which is executed by the at least one processor, the corruption logic to determine that data included in one or more source data blocks is corrupted or unreadable. The system may also include a recover logic, at least a portion of which is executed by the at least one processor, the recover logic to recover data included in the one or more corrupted source data blocks via use of non-corrupted source data blocks with one or more local parity blocks or with one or more global parity blocks.

Example 30

The system of example 29 may also include the recover logic to verify that recovered data was correctly recovered. For this example, to verify recovered data was correctly recovered may include the recover logic to recover a first version of the data using a first set that includes one or more non-corrupted source data blocks, one or more local parity blocks or one or more global parity blocks. The recover logic may also recover a second version of the data using a second set that includes one or more non-corrupted source data blocks, one or more local parity blocks or one or more global parity blocks, at least one non-corrupted source data block, local parity block or global parity block is different for blocks included in the first set compared to blocks included in the second set. The recover logic may also compare the first version with the second version. The recover logic may also determine the recovered data was correctly recovered if the first version matches the second version.

Example 31

The system of example 30, the recover logic to determine the first version of the data does not match the second version of the data. For this example, the recover logic to verify that recovered data was correctly recovered may further include the recover logic to recover a third version of the data via use of a third set that includes one or more non-corrupted source data blocks, one or more local parity blocks or one or more global parity blocks, at least one non-corrupted source data block, local parity block or global parity block is different for blocks included in both the first and second sets compared to blocks included in the third set. The recover logic may also compare the first version with the third version. The recover logic may also determine the recovered data was correctly recovered if the first version matches the third version.

Example 32

The system of example 29, comprising the erasure code logic to cause the erasure code to be implemented via use of values of k=10, r=2, p=2 and m=2 for the erasure code. For this example, the local and global parity blocks may be computed based on a Vandermond matrix and a Galois field of $(2^{10})$.

Example 33

The system of example 32 may also include the corruption logic to determine that data included in a single source data block is corrupted or unreadable. For this example the recover logic to recover data included in the single corrupted source data block includes the recover logic to identify that the single corrupted source data block is included in a first local group from among the 2 local groups that includes k/r or 5 source data blocks. The recover logic may also recover data included in the single corrupted source data block via use of non-corrupted source data blocks included in the first local group and use of one or more of the 2 local parity blocks protecting the 5 source data blocks in the first local group. The recover logic may also verify that recovered data was correctly recovered. For the recover logic to verify the data was correctly recovered may include the recover logic to recover a first version of the data via use of a first set that includes at least three of the non-corrupted source data blocks and one or more of the local parity blocks. The recover logic may also recover a second version of the data via use of a second set that includes at least three of the non-corrupted source data blocks and one or more local parity blocks, at least one non-corrupted source data block or local parity block is different for blocks included in the first set compared to blocks included in the second set. The recover logic may also compare the first version with the second version and determine the recovered data was correctly recovered if the first version matches the second version.

Example 34

The system of example 33, the recover logic may determine the first version of the data does not match the second version of the data. For this example, the recover logic to verify that recovered data was correctly recovered may further include the recover logic to recover a third version of the data via use of a third set that includes at least three of the non-corrupted source data blocks and one or more local parity blocks, at least one non-corrupted source data block or local parity block is different for blocks included in both the first and second sets compared to blocks included in the third set. The recover logic may also compare the first version with the third version. The recover logic may also determine the recovered data was correctly recovered if the first version matches the third version.

Example 35

The system of example 32 may also include the corruption logic to determine that data included in two source data blocks is corrupted or unreadable. For this example, the recover logic to recover data included in the two corrupted source data blocks includes the recover logic to identify that the two corrupted source data blocks are included in a first local group from among the 2 local groups that includes k/r or 5 source data blocks. The recover logic may also recover the data included in the two corrupted source data blocks via use of non-corrupted source data blocks included in the first local group and the 2 local parity blocks protecting the 5 source data blocks in the first local group. The recover logic may also verify that recovered data was correctly recovered. For the recover logic to verify the data was correctly recovered includes the recover logic to identify the data recovered via use of non-corrupted source data blocks included in the first local group and use of one or more of the local parity blocks protecting the 5 source data blocks in the first local group as a first version of the data. The recover logic may also recover a second version of the data via use of a first set that at least three non-corrupted source data blocks from among the 10 source data blocks not included in the first local group and use of one or more of the 2 global parity blocks protecting all 10 source data blocks. The recover logic may also compare the first version with the second version and determine the recovered data was correctly recovered if the first version matches the second version.

Example 36

The system of example 35, the recover logic may determine the first version of the data does not match the second version of the data. For this example, the recover logic to verify that recovered data was correctly recovered may further include the recover logic to recover a third version of the data via use of a second set that includes at least three of the non-corrupted source data blocks from among the 10 source data blocks not included in the first local group and use of one or more of the 2 global parity blocks protecting all 10 source data blocks, at least one non-corrupted source data block or global parity block is different for blocks included in both the first set compared to blocks included in the third set. The recover logic may also compare the first version with the third version and determine the recovered data was correctly recovered if the first version matches the third version.

Example 37

The system of example 32 may also include the corruption logic to determine that data included in three source data blocks is corrupted or unreadable. For this example, the recover logic to recover data included the three corrupted source data blocks includes the recover logic to identify that the three corrupted source data blocks are included in a first local group from among the 2 local groups that includes k/r or 5 source data blocks. The recover logic may also compute k/r or 2 additional global parity blocks based on 2 local parity blocks for each of the 2 local groups. The recover logic may also recover data included in the three corrupted source data blocks vi use of non-corrupted source data blocks from among the 10 source data blocks and use of one or more of the 2 global parity blocks or the 2 additional global parity blocks. The recover logic may also verify that recovered data was correctly recovered. For the recover logic to verify the data was correctly recovered may include the recover logic to recover a first version of the data via use of a first set that include one or more non-corrupted source data blocks from among the 10 source data blocks and use at least 3 of a combination of the 2 global parity blocks or the 2 additional global parity blocks. The recover logic may also recover a second version of the data via use of a second set that includes one or more of the non-corrupted source data blocks from among the 10 source data blocks and using one or more of the 2 global parity blocks or the 2 additional global parity blocks, at least one non-corrupted source data block or global parity block is different for blocks included in the first set compared to blocks included in the second set. The recover logic may also compare the first version with the second version and determine the recovered data was correctly recovered if the first version matches the second version.

Example 38

The system of example 37, the recover logic may determine the first version of the data does not match the second version of the data. For this example, the recover logic to verify that recovered data was correctly recovered may further include the recover logic to recover a third version of the data via use of a third set that includes one or more of the non-corrupted source data blocks from among the 10 source data blocks and use of one or more of the 2 global parity blocks or the 2 additional global parity blocks, at least one non-corrupted source data block or global parity block is different for blocks included in both the first and second sets compared to blocks included in the third set. The recover logic may also compare the first version with the third version and determine the recovered data was correctly recovered if the first version matches the third version.

Example 39

The system of example 32 may also include the corruption logic to determine that data included four source data blocks is corrupted or unreadable. For this examples, the recover logic to recover data included the four corrupted source data blocks includes the recover logic to identify that one of the four corrupted source data blocks is included in a first local group from among the 2 local groups that includes k/r or 5 source data blocks. The recover logic may also recover data included in the single corrupted source data block via use of non-corrupted source data blocks included in the first local group and use of one or more of the 2 local parity blocks protecting the 5 source data blocks in the first local group. The recover logic may also verify that data recovered from the one corrupted source data block was correctly recovered. For the recover logic to verify the data was correctly recovered may include the recover logic to recover a first version of the data recovered from the one corrupted source data block via use of a first set that includes one or more of the non-corrupted source data blocks and one or more of the local parity blocks. The recover logic may also recover a second version of the data recovered from the one corrupted source data block via use of a second set that includes one or more of the non-corrupted source data blocks and one or more local parity blocks, at least one non-corrupted source data block or local parity block is different for blocks included in the first set compared to blocks included in the second set. The recover logic may also compare the first version of the data recovered from the one corrupted source data block with the second version of the data recovered from the one corrupted source data block and determine the recovered data recovered from the one corrupted data source data block was correctly recovered if the first version of the data recovered from the one corrupted source data block matches the second version of the data recovered from the one corrupted source data block. The recover logic may also identify that the remaining three corrupted source data blocks are included in a second local group from among the 2 local groups that includes k/r or 5 source data blocks. The recover logic may also compute 2 additional global parity blocks based on 2 local parity blocks for each of the 2 local groups. The recover logic may also recover data included in the three corrupted source data blocks via use of non-corrupted source data blocks from among the 5 source data blocks and use of at least 3 of a combination of the 2 global parity blocks or the 2 additional global parity blocks. The recover logic may also verify that data recovered from the three corrupted source data blocks correctly recovered, to verify the data was correctly recovered includes the recover logic to recover a first version of the data recovered from the three corrupted source data blocks via use of a third set that includes one or more non-corrupted source data blocks from among the 10 source data blocks and use of one or more of the 2 global parity blocks or the 2 additional global parity blocks. The recover logic may also recover a second version of the data recovered from the three corrupted source data blocks via use of a fourth set that includes one or more of the non-corrupted source data blocks from among the 10 source data blocks and use of one or more of the 2 global parity blocks or the 2 additional global parity blocks, at least one non-corrupted source data block or global parity block is different for blocks included in the third set compared to blocks included in the fourth set. The recover logic may also compare the first version of data recovered from the three corrupted source data blocks with the second version data recovered from the three corrupted source data blocks. The recover logic may also determine the recovered data was correctly recovered if the first version data recovered from the three corrupted source data blocks matches the second version data recovered from the three corrupted source data blocks.

Example 40

The system of example 32 may also include the corruption logic to determine that data included in four source data blocks is corrupted or unreadable. For this example, the recover logic to recover data included the four source data blocks includes the recover logic to identify that the four corrupted source data blocks are included in a first local group from among the 2 local groups that includes k/r or 5 source data blocks. The recover logic may also compute k/r or 2 additional global parity blocks based on 2 local parity blocks for each of the 2 local groups. The recover logic may also recover data included in the four corrupted source data blocks via use of non-corrupted source data blocks from among the 10 source data blocks, the 2 global parity blocks and the 2 additional global parity blocks.

Example 41

The system of example 29, the storage device may include non-volatile or volatile types of memory. For this example, the non-volatile types of memory may include 3-dimensional cross-point memory, memory that uses chalcogenide phase change material, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

Example 42

The system of example 29 may also include one or more of a network interface communicatively coupled to the at least one processor, a display communicatively coupled to the at least one processor or a battery communicatively coupled to the at least one processor.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
an erasure code logic, at least a portion of which is in hardware, the erasure code logic to cause an erasure coding to be implemented to protect a data file or data object stored to a plurality of nodes of a networked storage system in a plurality of source data blocks, the erasure coding based on (k, r, p, m), where k represents source data blocks separately stored to nodes of the networked storage system, r represents a number of local groups that separately include k/r source data blocks, p represents a number of local parity blocks separately stored to nodes of the networked storage system to separately protect the k/r source data blocks included in each local group and m represents a number of global parity blocks separately stored to nodes of the networked storage system to protect all k source data blocks;
a corruption logic, at least a portion of which is in hardware, the corruption logic to determine that data included in one or more source data blocks is corrupted or unreadable; and
a recover logic, at least a portion of which is in hardware, the recover logic to recover data included in the one or more corrupted source data blocks via use of non-corrupted source data blocks with one or more local parity blocks or with one or more global parity blocks.

2. The apparatus of claim 1, comprising the recover logic to verify that recovered data was correctly recovered, to verify recovered data was correctly recovered includes the recover logic to:
recover a first version of the data using a first set that includes one or more non-corrupted source data blocks, one or more local parity blocks or one or more global parity blocks;
recover a second version of the data using a second set that includes one or more non-corrupted source data blocks, one or more local parity blocks or one or more global parity blocks, at least one non-corrupted source data block, local parity block or global parity block is different for blocks included in the first set compared to blocks included in the second set;
compare the first version with the second version; and
determine the recovered data was correctly recovered if the first version matches the second version.

3. The apparatus of claim 2, the recover logic to determine the first version of the data does not match the second version of the data, the recover logic to verify that recovered data was correctly recovered further comprising the recover logic to:
recover a third version of the data via use of a third set that includes one or more non-corrupted source data blocks, one or more local parity blocks or one or more global parity blocks, at least one non-corrupted source data block, local parity block or global parity block is different for blocks included in both the first and second sets compared to blocks included in the third set;
compare the first version with the third version; and
determine the recovered data was correctly recovered if the first version matches the third version.

4. The apparatus of claim 1, comprising the erasure code logic to cause the erasure code to be implemented via use of values of k=10, r=2, p=2 and m=2 for the erasure code, the local and global parity blocks computed based on a Vandermond matrix and a Galois field of ($2^{10}$).

5. The apparatus of claim 4, comprising:
the corruption logic to determine that data included in a single source data block is corrupted or unreadable; and
the recover logic to recover data included in the single corrupted source data block includes the recover logic to:
identify that the single corrupted source data block is included in a first local group from among the 2 local groups that includes k/r or 5 source data blocks;
recover data included in the single corrupted source data block via use of non-corrupted source data blocks included in the first local group and use of one or more of the 2 local parity blocks protecting the 5 source data blocks in the first local group; and
verify that recovered data was correctly recovered, to verify the data was correctly recovered includes the recover logic to:
recover a first version of the data via use of a first set that includes at least three of the non-corrupted source data blocks and one or more of the local parity blocks;
recover a second version of the data via use of a second set that includes at least three of the non-corrupted source data blocks and one or more local parity blocks, at least one non-corrupted source data block or local parity block is different for blocks included in the first set compared to blocks included in the second set;
compare the first version with the second version; and
determine the recovered data was correctly recovered if the first version matches the second version.

6. The apparatus of claim 5, the recover logic to determine the first version of the data does not match the second version of the data, the recover logic to verify that recovered data was correctly recovered further comprising the recover logic to:
recover a third version of the data via use of a third set that includes at least three of the non-corrupted source data blocks and one or more local parity blocks, at least one non-corrupted source data block or local parity block is different for blocks included in both the first and second sets compared to blocks included in the third set;
compare the first version with the third version; and
determine the recovered data was correctly recovered if the first version matches the third version.

7. The apparatus of claim 4, comprising:
the corruption logic to determine that data included in two source data blocks is corrupted or unreadable; and
the recover logic to recover data included in the two corrupted source data blocks includes the recover logic to:
identify that the two corrupted source data blocks are included in a first local group from among the 2 local groups that includes k/r or 5 source data blocks;
recover the data included in the two corrupted source data blocks via use of non-corrupted source data blocks included in the first local group and the 2 local parity blocks protecting the 5 source data blocks in the first local group; and verify that recovered data was correctly recovered, to verify the data was correctly recovered includes the recover logic to:
identify the data recovered via use of non-corrupted source data blocks included in the first local group and use of one or more of the local parity blocks protecting the 5 source data blocks in the first local group as a first version of the data;
recover a second version of the data via use of a first set that includes at least three non-corrupted source data blocks from among the 10 source data blocks not included in the first local group and use of one or more of the 2 global parity blocks protecting all 10 source data blocks;
compare the first version with the second version; and
determine the recovered data was correctly recovered if the first version matches the second version.

8. The apparatus of claim 7, the recover logic to determine the first version of the data does not match the second version of the data, the recover logic to verify that recovered data was correctly recovered further comprising the recover logic to:
recover a third version of the data via use of a second set that includes at least three of the non-corrupted source data blocks from among the 10 source data blocks not included in the first local group and use of one or more of the 2 global parity blocks protecting all 10 source data blocks, at least one non-corrupted source data block or global parity block is different for blocks included in both the first set compared to blocks included in the third set;
compare the first version with the third version; and
determine the recovered data was correctly recovered if the first version matches the third version.

9. The apparatus of claim 4, comprising:
the corruption logic to determine that data included in three source data blocks is corrupted or unreadable; and
the recover logic to recover data included the three corrupted source data blocks includes the recover logic to:
identify that the three corrupted source data blocks are included in a first local group from among the 2 local groups that includes k/r or 5 source data blocks;
compute k/r or 2 additional global parity blocks based on 2 local parity blocks for each of the 2 local groups;
recover data included in the three corrupted source data blocks vi use of non-corrupted source data blocks from among the 10 source data blocks and use of one or more of the 2 global parity blocks or the 2 additional global parity blocks; and
verify that recovered data was correctly recovered, to verify the data was correctly recovered includes the recover logic to:
recover a first version of the data via use of a first set that include one or more non-corrupted source data blocks from among the 10 source data blocks and use at least 3 of a combination of the 2 global parity blocks or the 2 additional global parity blocks;
recover a second version of the data via use of a second set that includes one or more of the non-corrupted source data blocks from among the 10 source data blocks and using one or more of the 2 global parity blocks or the 2 additional global parity blocks, at least one non-corrupted source data block or global parity block is different for blocks included in the first set compared to blocks included in the second set;
compare the first version with the second version; and
determine the recovered data was correctly recovered if the first version matches the second version.

10. The apparatus of claim 9, the recover logic to determine the first version of the data does not match the second version of the data, the recover logic to verify that recovered data was correctly recovered further comprising the recover logic to:
recover a third version of the data via use of a third set that includes one or more of the non-corrupted source data blocks from among the 10 source data blocks and use of one or more of the 2 global parity blocks or the 2 additional global parity blocks, at least one non-corrupted source data block or global parity block is different for blocks included in both the first and second sets compared to blocks included in the third set;
compare the first version with the third version; and
determine the recovered data was correctly recovered if the first version matches the third version.

11. The apparatus of claim 1, the networked storage system includes non-volatile or volatile types of memory, the non-volatile types of memory comprising 3-dimensional cross-point memory, memory that uses chalcogenide phase change material, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque magnetoresistive random access memory (STT-MRAM).

12. A method comprising:
implementing, at a processor circuit, an erasure coding scheme for a networked storage system based on (k, r, p, m), where k represents source data blocks separately stored to nodes of the networked storage system, r represents a number of local groups separately including k/r source data blocks, p represents a number of local parity blocks separately stored to nodes of the networked storage system for protecting the k/r source data blocks included in each local group and m represents a number of global parity blocks separately stored to nodes of the networked storage system for protecting all k source data blocks;
determining that data included in one or more source data blocks is corrupted or unreadable; and
recovering data included in the one or more corrupted source data blocks using non-corrupted source data blocks and one or more local parity blocks or using one or more global parity blocks.

13. The method of claim 12, comprising:
verifying that recovered data was correctly recovered by:
recovering a first version of the data using a first set including one or more non-corrupted source data blocks, one or more local parity blocks or one or more global parity blocks;
recovering a second version of the data using a second set including one or more non-corrupted source data blocks, one or more local parity blocks or one or more global parity blocks, at least one non-corrupted source data block, local parity block or global parity block is different for blocks included in the first set compared to blocks included in the second set;
comparing the first version with the second version; and
determining the recovered data was correctly recovered if the first version matches the second version.

14. The method of claim 13, the first version of the data not matching the second version of the data, verifying that recovered data was correctly recovered further comprising:
recovering a third version of the data using a third set including one or more non-corrupted source data blocks, one or more local parity blocks or one or more global parity blocks, at least one non-corrupted source data block, local parity block or global parity block is different for blocks included in both the first and second sets compared to blocks included in the third set;
comparing the first version with the third version; and
determining the recovered data was correctly recovered if the first version matches the third version.

15. The method of claim 12, comprising implementing the erasure coding scheme with k=10, r=2, p=2 and m=2, the local and global parity blocks computed based on a Vandermond matrix and a Galois field of $(2^{10})$.

16. The method of claim 15, comprising determining that data included in a single source data block is corrupted or unreadable, recovering data included in the single corrupted source data block includes:
identifying that the single corrupted source data block is included in a first local group from among the 2 local groups that includes k/r or 5 source data blocks;
recovering data included in the single corrupted source data block using non-corrupted source data blocks included in the first local group and using one or more of the 2 local parity blocks protecting the 5 source data blocks in the first local group; and
verifying that recovered data was correctly recovered by:
recovering a first version of the data using a first set including at least three of the non-corrupted source data blocks and one or more of the local parity blocks;
recovering a second version of the data using a second set including at least three of the non-corrupted source data blocks and one or more local parity blocks, at least one non-corrupted source data block or local parity block is different for blocks included in the first set compared to blocks included in the second set;
comparing the first version with the second version; and
determining the recovered data was correctly recovered if the first version matches the second version.

17. The method of claim 15, comprising determining that data included in four source data blocks is corrupted or unreadable, recovering data included the four corrupted source data blocks includes:
identifying that one of the four corrupted source data blocks is included in a first local group from among the 2 local groups that includes k/r or 5 source data blocks;
recovering data included in the single corrupted source data block using non-corrupted source data blocks included in the first local group and using one or more of the 2 local parity blocks protecting the 5 source data blocks in the first local group;

verifying that data recovered from the one corrupted source data block was correctly recovered by:
recovering a first version of the data recovered from the one corrupted source data block using a first set including one or more of the non-corrupted source data blocks and one or more of the local parity blocks;
recovering a second version of the data recovered from the one corrupted source data block using a second set including one or more of the non-corrupted source data blocks and one or more local parity blocks, at least one non-corrupted source data block or local parity block is different for blocks included in the first set compared to blocks included in the second set;
comparing the first version of the data recovered from the one corrupted source data block with the second version of the data recovered from the one corrupted source data block; and
determining the recovered data recovered from the one corrupted data source data block was correctly recovered if the first version of the data recovered from the one corrupted source data block matches the second version of the data recovered from the one corrupted source data block;
identifying that the remaining three corrupted source data blocks are included in a second local group from among the 2 local groups that includes k/r or 5 source data blocks;
computing 2 additional global parity blocks based on 2 local parity blocks for each of the 2 local groups;
recovering data included in the three corrupted source data blocks using non-corrupted source data blocks from among the 5 source data blocks and using at least 3 of a combination of the 2 global parity blocks or the 2 additional global parity blocks; and
verifying that data recovered from the three corrupted source data blocks correctly recovered by:
recovering a first version of the data recovered from the three corrupted source data blocks using a third set including one or more non-corrupted source data blocks from among the 10 source data blocks and using one or more of the 2 global parity blocks or the 2 additional global parity blocks;
recovering a second version of the data recovered from the three corrupted source data blocks using a fourth set including one or more of the non-corrupted source data blocks from among the 10 source data blocks and using one or more of the 2 global parity blocks or the 2 additional global parity blocks, at least one non-corrupted source data block or global parity block is different for blocks included in the third set compared to blocks included in the fourth set;
comparing the first version of data recovered from the three corrupted source data blocks with the second version data recovered from the three corrupted source data blocks; and
determining the recovered data was correctly recovered if the first version data recovered from the three corrupted source data blocks matches the second version data recovered from the three corrupted source data blocks.

18. The method of claim 12, determining that data included in four source data blocks is corrupted or unreadable, recovering data included the four corrupted source data blocks includes:

identifying that the four corrupted source data blocks are included in a first local group from among the 2 local groups that includes k/r or 5 source data blocks;
computing k/r or 2 additional global parity blocks based on 2 local parity blocks for each of the 2 local groups;
recovering data included in the four corrupted source data blocks using non-corrupted source data blocks from among the 10 source data blocks, the 2 global parity blocks and the 2 additional global parity blocks.

19. A system comprising:
at least one processor for a node of a networked storage system;
a storage device coupled with the node to store at least a portion of a data file or object stored to a plurality of nodes of a networked storage system in a plurality of source data blocks;
an erasure code logic, at least a portion of which is executed by the at least one processor, the erasure code logic to cause an erasure coding to be implemented to protect the data file or data object stored to the plurality of nodes of the networked storage system, the erasure coding based on (k, r, p, m), where k represents source data blocks separately stored to nodes of the networked storage system, r represents a number of local groups that separately include k/r source data blocks, p represents a number of local parity blocks separately stored to nodes of the networked storage system to separately protect the k/r source data blocks included in each local group and m represents a number of global parity blocks separately stored to nodes of the networked storage system to protect all k source data blocks;
a corruption logic, at least a portion of which is executed by the at least one processor, the corruption logic to determine that data included in one or more source data blocks is corrupted or unreadable; and
a recover logic, at least a portion of which is executed by the at least one processor, the recover logic to recover data included in the one or more corrupted source data blocks via use of non-corrupted source data blocks with one or more local parity blocks or with one or more global parity blocks.

20. The system of claim 19, comprising the recover logic to verify that recovered data was correctly recovered, to verify recovered data was correctly recovered includes the recover logic to:
recover a first version of the data using a first set that includes one or more non-corrupted source data blocks, one or more local parity blocks or one or more global parity blocks;
recover a second version of the data using a second set that includes one or more non-corrupted source data blocks, one or more local parity blocks or one or more global parity blocks, at least one non-corrupted source data block, local parity block or global parity block is different for blocks included in the first set compared to blocks included in the second set;
compare the first version with the second version; and
determine the recovered data was correctly recovered if the first version matches the second version.

21. The system of claim 20, the recover logic to determine the first version of the data does not match the second version of the data, the recover logic to verify that recovered data was correctly recovered further comprising the recover logic to:
recover a third version of the data via use of a third set that includes one or more non-corrupted source data blocks, one or more local parity blocks or one or more global parity blocks, at least one non-corrupted source data block, local parity block or global parity block is different for blocks included in both the first and second sets compared to blocks included in the third set;
compare the first version with the third version; and
determine the recovered data was correctly recovered if the first version matches the third version.

22. The system of claim 20, comprising:
the corruption logic to determine that data included in a single source data block is corrupted or unreadable; and
the recover logic to recover data included in the single corrupted source data block includes the recover logic to:
identify that the single corrupted source data block is included in a first local group from among the 2 local groups that includes k/r or 5 source data blocks;
recover data included in the single corrupted source data block via use of non-corrupted source data blocks included in the first local group and use of one or more of the 2 local parity blocks protecting the 5 source data blocks in the first local group; and
verify that recovered data was correctly recovered, to verify the data was correctly recovered includes the recover logic to:
recover a first version of the data via use of a first set that includes at least three of the non-corrupted source data blocks and one or more of the local parity blocks;
recover a second version of the data via use of a second set that includes at least three of the non-corrupted source data blocks and one or more local parity blocks, at least one non-corrupted source data block or local parity block is different for blocks included in the first set compared to blocks included in the second set;
compare the first version with the second version; and
determine the recovered data was correctly recovered if the first version matches the second version.

23. The system of claim 22, the recover logic to determine the first version of the data does not match the second version of the data, the recover logic to verify that recovered data was correctly recovered further comprising the recover logic to:
recover a third version of the data via use of a third set that includes at least three of the non-corrupted source data blocks and one or more local parity blocks, at least one non-corrupted source data block or local parity block is different for blocks included in both the first and second sets compared to blocks included in the third set;
compare the first version with the third version; and
determine the recovered data was correctly recovered if the first version matches the third version.

24. The system of claim 19, comprising the erasure code logic to cause the erasure code to be implemented via use of values of k=10, r=2, p=2 and m=2 for the erasure code, the local and global parity blocks computed based on a Vandermond matrix and a Galois field of ($2^{10}$).

25. The system of claim 19, further comprising one or more of:
- a network interface communicatively coupled to the at least one processor;
- a display communicatively coupled to the at least one processor; or
- a battery communicatively coupled to the at least one processor.

* * * * *